(12) United States Patent
Niaz

(10) Patent No.: US 9,617,887 B2
(45) Date of Patent: Apr. 11, 2017

(54) EMISSIONS CLEANING MODULE FOR AN ENGINE

(71) Applicant: Perkins Engines Company Limited, Cambridgeshire (GB)

(72) Inventor: Naseer A. Niaz, Cambridgeshire (GB)

(73) Assignee: Perkins Engines Company Limited, Peterborough (GB)

( * ) Notice: Subject to any disclaimer, the term of this patent is extended or adjusted under 35 U.S.C. 154(b) by 157 days.

(21) Appl. No.: 14/391,138

(22) PCT Filed: Apr. 10, 2013

(86) PCT No.: PCT/GB2013/050930
§ 371 (c)(1),
(2) Date: Oct. 7, 2014

(87) PCT Pub. No.: WO2013/160657
PCT Pub. Date: Oct. 31, 2013

(65) Prior Publication Data
US 2015/0071827 A1 Mar. 12, 2015

(30) Foreign Application Priority Data
Apr. 24, 2012 (GB) .................................. 1207201.3

(51) Int. Cl.
*B01D 50/00* (2006.01)
*F01N 3/20* (2006.01)
(Continued)

(52) U.S. Cl.
CPC ........... *F01N 3/20* (2013.01); *B01D 46/0002* (2013.01); *B01D 46/0057* (2013.01);
(Continued)

(58) Field of Classification Search
CPC ...... F01N 3/28; F01N 2260/022; F01N 3/021; F01N 13/18; F01N 2450/22; F01N 13/14
(Continued)

(56) References Cited

U.S. PATENT DOCUMENTS 7,282,185 B2 * 10/2007 Harris ................ B01D 53/9454
181/249
2003/0051449 A1  3/2003 Nishiyama et al.
(Continued)

FOREIGN PATENT DOCUMENTS

EP  0722040  7/1996
GB  2466277 A  6/2010

OTHER PUBLICATIONS

European Patent Office, International Search Report in International Patent Application No. PCT/GB2013/050930, Jun. 21, 2013, 4 pp.

*Primary Examiner* — Tom P Duong

(57) ABSTRACT

The disclosure provides an emissions cleaning module for cleaning emissions output from an internal combustion engine. The emissions cleaning module may include a first conduit, a second conduit, a third conduit, a first end coupling and a second end coupling which together provide a continuous fluid path. The first, second and third conduits may be supported at one end by a first support member and at an opposite end by a second support member. The first, second and third conduits may be mutually parallel. The support members, conduits and couplings may be arranged with relative substantial translational movement thereof restricted.

20 Claims, 25 Drawing Sheets

(51) Int. Cl.
| | |
|---|---|
| F01N 3/28 | (2006.01) |
| F01N 13/08 | (2010.01) |
| F01N 13/00 | (2010.01) |
| F01N 13/14 | (2010.01) |
| F01N 13/18 | (2010.01) |
| F01N 3/021 | (2006.01) |
| F01N 3/02 | (2006.01) |
| F01N 3/023 | (2006.01) |
| G01M 15/10 | (2006.01) |
| B60R 13/08 | (2006.01) |
| B01D 46/00 | (2006.01) |
| F01N 3/08 | (2006.01) |
| B01D 53/86 | (2006.01) |
| F01N 3/035 | (2006.01) |
| B01D 53/92 | (2006.01) |
| F01N 9/00 | (2006.01) |
| H05K 5/02 | (2006.01) |
| H05K 7/20 | (2006.01) |
| B01F 5/06 | (2006.01) |
| F01N 1/08 | (2006.01) |

(52) U.S. Cl.
CPC ........... *B01D 53/864* (2013.01); *B01D 53/92* (2013.01); *B60R 13/0876* (2013.01); *F01N 3/02* (2013.01); *F01N 3/021* (2013.01); *F01N 3/0233* (2013.01); *F01N 3/035* (2013.01); *F01N 3/08* (2013.01); *F01N 3/28* (2013.01); *F01N 3/2892* (2013.01); *F01N 9/00* (2013.01); *F01N 13/00* (2013.01); *F01N 13/008* (2013.01); *F01N 13/08* (2013.01); *F01N 13/14* (2013.01); *F01N 13/143* (2013.01); *F01N 13/18* (2013.01); *F01N 13/1805* (2013.01); *G01M 15/102* (2013.01); *H05K 5/02* (2013.01); *H05K 7/20436* (2013.01); *B01F 5/0613* (2013.01); *B01F 2005/0621* (2013.01); *B01F 2005/0636* (2013.01); *F01N 1/086* (2013.01); *F01N 2240/20* (2013.01); *F01N 2260/022* (2013.01); *F01N 2260/20* (2013.01); *F01N 2450/22* (2013.01); *F01N 2470/04* (2013.01); *F01N 2490/06* (2013.01); *F01N 2610/1453* (2013.01); *Y10T 29/49345* (2015.01)

(58) Field of Classification Search
USPC .................................................. 422/168, 169
See application file for complete search history.

(56) References Cited

U.S. PATENT DOCUMENTS

| | | | |
|---|---|---|---|
| 2006/0156712 A1* | 7/2006 | Buhmann | F01N 3/0335 60/297 |
| 2007/0289294 A1* | 12/2007 | Werni | F01N 1/084 60/299 |
| 2008/0314033 A1 | 12/2008 | Aneja et al. | |
| 2009/0158720 A1* | 6/2009 | Krause | F01N 1/084 60/297 |
| 2009/0229913 A1 | 9/2009 | Tonietto et al. | |
| 2009/0293467 A1* | 12/2009 | Boeckenhoff | F01N 3/021 60/324 |
| 2011/0146252 A1* | 6/2011 | Silver | F01N 3/035 60/301 |
| 2012/0222413 A1* | 9/2012 | Golin | F01N 3/021 60/311 |

\* cited by examiner

EMISSIONS CLEANING MODULE FOR AN ENGINE

TECHNICAL FIELD

The disclosure relates to an apparatus for cleaning fluids emitted during the operation of combustion engines.

BACKGROUND

Engines, for example IC engines burning gasoline, diesel or biofuel, output various substances which must be treated to meet current and future emissions legislation. Most commonly those substances comprise hydrocarbons (HC), carbon monoxides (CO), mono-nitrogen oxides ($NO_x$) and particulate matter, such as carbon (C), a constituent of soot. Some of those substances may be reduced by careful control of the operating conditions of the engine, but usually it is necessary to provide an emissions cleaning module downstream of the engine to treat at least some of those substances entrained in the exhaust gas. Various apparatus for reducing and/or eliminating constituents in emissions are known. For example, it is known to provide an oxidation device, such as a diesel oxidation catalyst, to reduce or to eliminate hydrocarbons (HC) and/or carbon monoxide (CO). Oxidation devices generally include a catalyst to convert those substances into carbon dioxide and water, which are significantly less harmful. As a further example, emissions cleaning modules may include filtration devices to restrict the particulates present in the exhaust gas from being output to atmosphere. The soot collected in the filtration device must later be removed to maintain the efficiency of the filtration device. The methods by which soot may be removed from the filtration device are well known in the art and may generally be referred to as regeneration which occurs at elevated temperatures. In addition, it is known to reduce or eliminate mono-nitrogen oxides ($NO_x$) in diesel combustion emissions by conversion to diatomic nitrogen ($N_2$) and water ($H_2O$) by catalytic reaction with chemicals such as ammonia ($NH_3$) entrained in the exhaust gas. Generally ammonia is not present in exhaust gas and must therefore be introduced upstream of a catalyst, typically by injecting a urea solution into the exhaust gas which decomposes into ammonia at sufficiently high temperatures.

By these methods, engine emissions can be cleaned, meaning that a proportion of the harmful substances which would otherwise be released to atmosphere are instead converted to carbon dioxide ($CO_2$), nitrogen ($N_2$) and water ($H_2O$).

Against this background there is provided an emissions cleaning module for a diesel engine.

SUMMARY OF THE DISCLOSURE

An emissions cleaning module may comprise:
first and second support members each having first, second and third openings;
a first conduit extending between the first and second support members and having an inlet and an outlet, the first conduit being arranged in registration with the first openings;
a second conduit extending between the first and second support members and having an inlet and an outlet, the second conduit being arranged in registration with the second openings;
a third conduit extending between the first and second support members and having an inlet and an outlet, the third conduit being arranged in registration with the third openings;
a first end coupling fluidly connecting the outlet of the first conduit to the inlet of the second conduit; and
a second end coupling fluidly connecting the outlet of the second conduit to the inlet of the third conduit,
such that a continuous fluid path is provided between the inlet of the first conduit and the outlet of the third conduit, wherein the support members, conduits and couplings are arranged in a manner in which relative substantial translational movement thereof is restricted.

BRIEF DESCRIPTION OF THE DRAWINGS

Two embodiments of the invention will now be described, by way of example only, with reference to the accompanying drawings in which.

DETAILED DESCRIPTION

In the following description two embodiments of emissions cleaning module will be described and components of said emissions cleaning modules will be discussed. It should be understood that, unless explicitly stated, features and components of one embodiment may be combined with features and components of another embodiment.

In addition, certain features and components may be present in more than one embodiment of the emissions cleaning module. In the following description, those features and components may be described fully with reference to only a single embodiment but, unless explicitly stated, may fully form part of the other embodiments described. Further, certain components may be described, for reasons of clarity, with reference to drawings relating to more than one embodiment.

Figure 1:
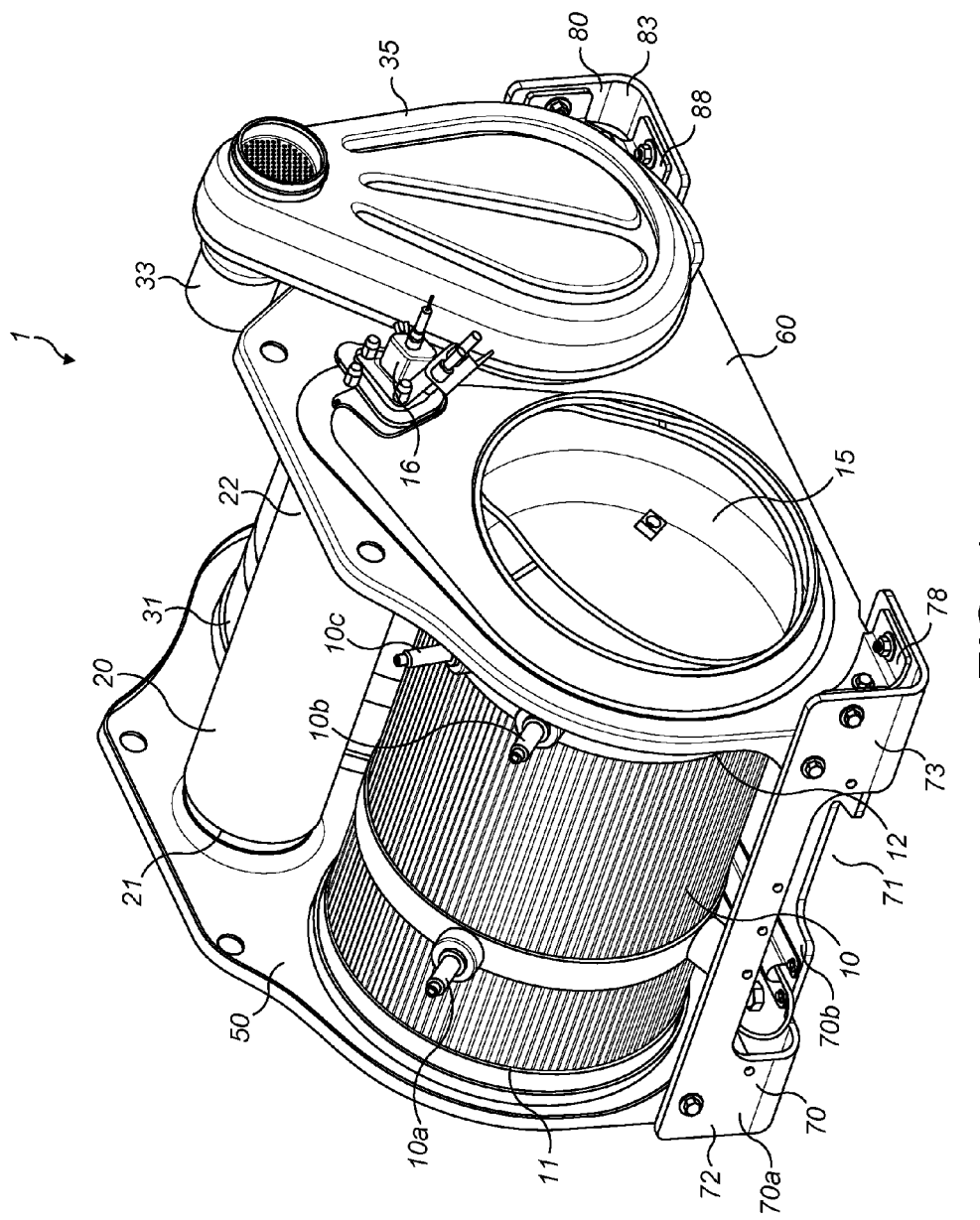
FIG. 1 shows an emissions cleaning module in accordance with a first embodiment of the disclosure.

A first embodiment of an emissions cleaning module 1 according to the disclosure is illustrated in FIG. 1.

The first embodiment of the emissions cleaning module 1 may comprise a first conduit 10, a second conduit 20, a third conduit 30, and a mounting arrangement 40. The mounting arrangement 40, is illustrated in FIG. 2, and may comprise a first support member 50 and a second support member 60.

Each support member 50, 60 may extend generally in a plane (first support member plane 500 and second support member plane 600, respectively) and may be of rigid material, for example metal. Each support member 50, 60 may have generally opposed inner and outer sides. The inner side 50a of the first support member 50, may face the inner side 60a of the second support member 60.

Figure 2:
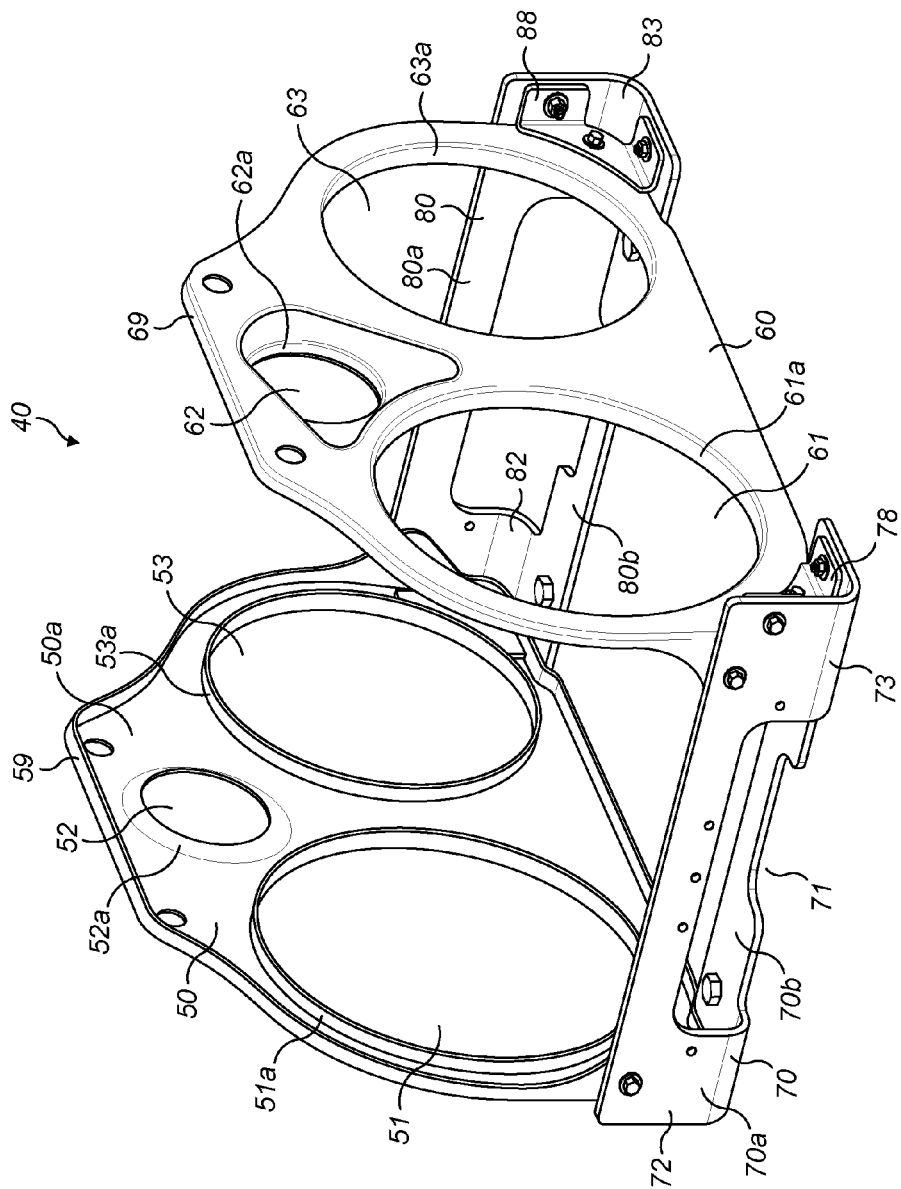
FIG. 2 shows a mounting arrangement attached to part of the emissions cleaning module shown in FIG. 1.

Each support member 50, 60 may comprise first, second and third openings 51, 52, 53, 61, 62, 63, best shown in FIG. 2. Each opening 51, 52, 53, 61, 62, 63 may comprise a lip 51a, 52a, 53a, 61a, 62a, 63a extending partway around a perimeter of the opening 51, 52, 53, 61, 62, 63 in a direction substantially perpendicular to the plane in which the support member 50, 60 generally extends. Each support member 50, 60 may further comprise an inwardly turned lip 59, 69 extending at least part way around a periphery of the support member 50, 60.

The first, second and third conduits 10, 20, 30 may be elongate, having an axis of elongation, and may have substantially constant cross-section along the axis of elongation. The first, second and third conduits 10, 20, 30 may be substantially cylindrical.

The first conduit 10 may comprise a first end 11 providing an inlet to the conduit and a second end 12 providing an outlet to the conduit. The second conduit 20 may comprise a first end 21 providing an outlet to the conduit and a second end 22 providing an inlet to the conduit. The third conduit 30 may comprise a first end 31 providing an inlet to the conduit and a second end (32, not visible in the figures) providing an output to the conduit.

The conduits 10, 20, 30 may extend between the support members 50, 60. The conduits 10, 20, 30 may be generally substantially parallel. The first ends 11, 21, 31 of the first, second and third conduits 10, 20, 30 may be received in and may be shaped to correspond with the first, second and third openings 51, 52, 53, respectively, of the first support member 50. The second ends 12, 22, 32 of the first, second and third conduits 10, 20, 30 may be received in and may be shaped to correspond with the first, second and third openings 61, 62, 63, respectively, of the first support member 60. By this arrangement, lateral movement of the conduits may be restricted. The axis of elongation of each conduit 10, 20, 30 may intersect a centre of the opening 51, 52, 53, 61, 62, 63 into which it is received.

The conduits 10, 20, 30 may all be of substantially similar length. The first conduit 10 may have a first diameter, the second conduit 20 may have a second diameter and the third conduit 30 may have a third diameter. The second diameter may be smaller than the first and third diameters.

The first and second ends 11, 21, 31, 12, 22, 32 of the conduits 10, 20, 30 may be welded, adhered or otherwise secured to portions of the support members 50, 60 defining or surrounding the openings 51, 52, 53, 61, 62, 63. Alternatively, first and second ends 11, 21, 31, 12, 22, 32 of the conduits 10, 20, 30 may abut the inner sides 50a, 60a of the support members 50, 60 so as to overlie respective openings 51, 52, 53, 61, 62, 63 in the support members 50, 60.

The first, second and third conduits 10, 20, 30 and the first and second support members 50, 60 may be interconnected in a manner which restricts relative translational movement of those components. Instead or in addition, the first, second and third conduits 10, 20, 30 and the first and second support members 50, 60 may be interconnected in a manner which restricts rotational movement of one component with respect to another.

The first conduit 10 may be coupled to the second conduit 20 via a first end coupling 15 for fluidly connecting the outlet of the first conduit to the inlet of the second conduit. The first end coupling 15 may comprise an injector module 16. The second conduit 20 may be coupled to the third conduit 30 via a second end coupling 25 (not visible in FIG. 1 which relates to the first embodiment, but visible in FIG. 12, which relates to the second embodiment) for fluidly connecting the outlet of the second conduit to the inlet of the third conduit. The third conduit 30 may comprise an output housing 35 at first end of the third conduit 30, the output housing 35 comprising an emissions cleaning module outlet 33. The output housing 35 may comprise a baffle.

The mounting arrangement 40 may further comprise a first brace 70 and a second brace 80. Each of the first and second braces 70, 80 may comprise a longitudinal beam having an L-shaped cross section at each end of the longitudinal direction of each beam but with a portion removed between the ends such that the cross section in a central region of the longitudinal direction of each beam comprises two mutually perpendicular and unconnected portions. Put another way, each of the first and second braces 70, 80 may comprise a rectangular plate with an aperture 71, 81 at the centre, each rectangular plate having a substantially 90° fold in a direction parallel to a longitudinal axis of the each first and second brace 70, 80 such that the fold intersects the aperture 71, 81. In such folded configuration, each L-shaped brace comprises a vertical portion 70a, 80a and a horizontal portion 70b, 80b.

The apertures 71, 81 of the first and second braces 70, 80 may each comprise a wide aperture portion towards the centre of the braces and narrow aperture portions on each side of the wide aperture portion.

The first and second braces 70, 80 may each be parallel to the elongate axis of each of the first, second and third conduits 10, 20, 30. The first brace 70 may be connected at a first end 72 to the first support member 50 and at a second end 73 to the second support member 60. Similarly, the second brace 80 may be connected at a first end 82 to the first support member 50 and at a second end 83 to the second support member 60.

The means of connection between the first and second braces 70, 80 and the first and second support members 50, 60 may be one or more clips 78, 88 independent from the first and second braces 70, 80 and the support members 50, 60 or may be integral to the first and second braces 70, 80 and/or the support members 50, 60. Alternatively, the means of connection may be a combination of one or more independent components and features integral to the first and second braces 70, 80 and/or the support members 50, 60.

The means of connection may comprise clips 78, 88 which may comprise a first plate parallel to a vertical portion of the L-shaped brace 70, 80, a second plate parallel to a horizontal portion of the L-shaped brace 70, 80 and a third plate orthogonal to both the first and the second plates. The first and second plates each comprise means for fixing to that portion of the L-shaped brace 70, 80 with which it is parallel. The third plate is configured such that it does not extend to the interior corner of the L-shape of the L-shaped brace 70, 80 so as to provide a passage for fluid from one side of the clip to the other side of the clip. This may avoid a reservoir forming in between the interior surfaces of the L-shaped brace 70, 80 and the third plate of the clip.

The first and second support members 50, 60 and the first and second braces 70, 80 may together form a rigid rectangular mounting arrangement 40 which may serve a purpose of holding the three conduits 10, 20, 30 relative to one another whilst accommodating differential expansion and/or contraction of components relative to each other. It will be appreciated by the skilled person that the support members 50, 60 are an essential part of the emissions cleaning module 1 since they each define a part of the flow passage and serve also to fix the relative positions of the conduits 10, 20, 30. However, the skilled person will also appreciate that the braces are not essential to the emissions cleaning module 1 and are provided primarily for mounting the emissions cleaning module to the chassis or the engine with which the emissions cleaning module is used. The braces also serve to strengthen the emissions cleaning module though this is secondary.

Figure 3:
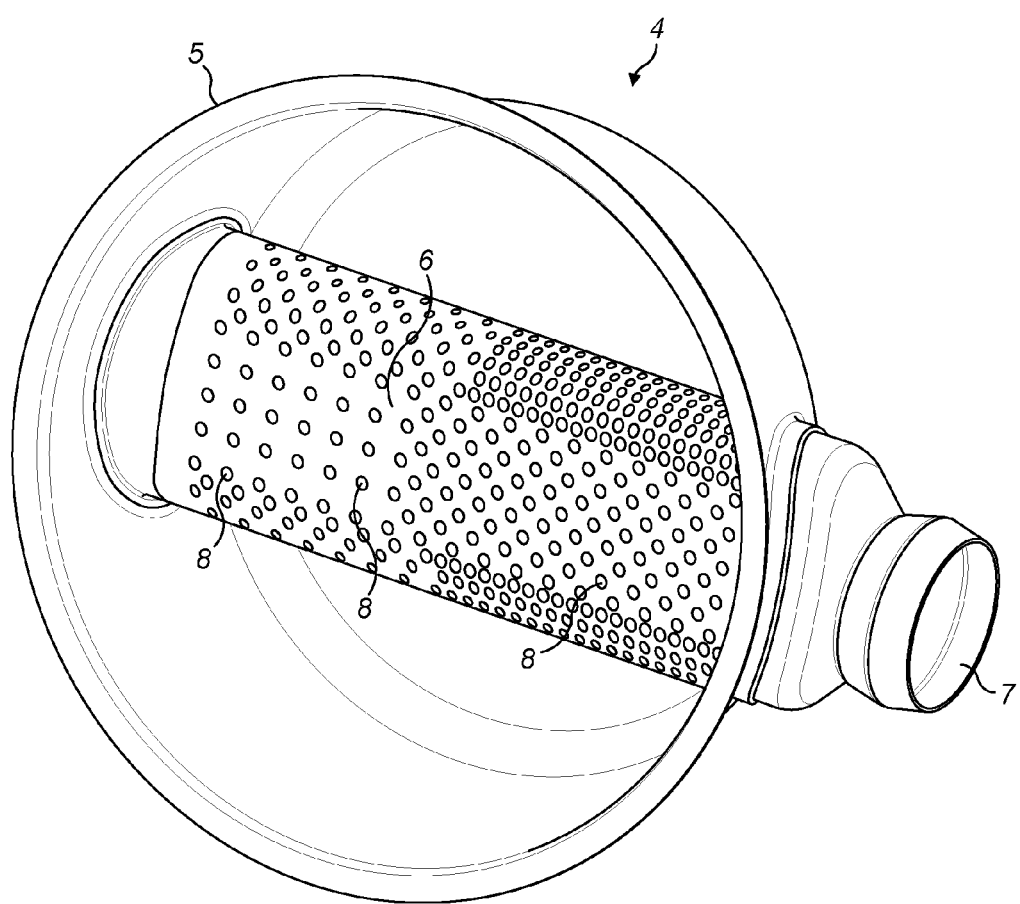
FIG. 3 shows an input housing for the emissions cleaning module shown in FIG. 1.

An input housing 4 (as seen independently of the emissions cleaning module in FIG. 3) for diffusing fluid emitted from an engine may be provided at the first end 11 of the first conduit 10 such that said fluid passes into a first portion of the first conduit 10. The input housing 4 may comprise a channel 6 having an input housing inlet 7 for receiving fluid. The channel 6 may comprise a plurality of apertures 8 to serve as an output from the channel. The apertures 8 may be distributed along the length of the channel 6 with a larger concentration of apertures 8 near the input housing inlet 7 of the channel 6 and a smaller concentration of apertures further from the input housing inlet 7 of the channel 6. The distribution of the plurality of apertures is intended to create a more even flow of fluid.

An output housing 35 for fluid from the emissions cleaning module 1 may be provided at the second end 32 of the third conduit. The output housing 35 may comprise an emissions cleaning module outlet 33 such that fluid may be released from the emissions cleaning module 1, perhaps into atmosphere. The output housing 35 may comprise a channel mounted internally. The channel may serve to provide rigidity to the outlet. The output housing 35 may further comprise a baffle.

Within the fluid flow path of the emissions cleaning module there may be located a diesel oxidation catalyst (DOC) module, a diesel particulate filter (DPF) module, an injector module, a mixer module, a selective catalyst reduction (SCR) module and an ammonia oxidation catalyst (AMOX) module.

The DOC module may be located in a first portion of the first conduit 10 towards the first, inlet, end 11 of the first conduit 10. The DPF module may be located in a second portion of the first conduit 10 towards the second, outlet, end 12 of the first conduit 10. The first end coupling 15 may provide a fluid flow path from the second end 12 of the first conduit 10 to the second end 22 of the second conduit 20. The first end coupling 15 may comprise the injector module 16.

A mixer module may be located in the second conduit 20. The mixer module may be configured to mix a fluid injected by the injector module 16 with a fluid arriving from the first conduit 10. The mixer module may comprise multiple features, such as interspersed fins, which may give rise to an even blend of the injected fluid with the fluid from the first conduit 10. The second end coupling 25 may provide a fluid flow path from the first end of the second conduit to the first end of the third conduit.

The SCR module may be located in a first portion of the third conduit 30 towards the first end 31 of the third conduit 30. The SCR module may comprise a catalyst surface intended to cause a chemical reaction to occur between the two fluids mixed in the mixer module. The AMOX module may both be located in a second portion of the third conduit 30 towards the second end 32 of the third conduit 30. The AMOX module may comprise a catalyst which may cause a chemical reaction of one or more of the products output from the SCR module. In some embodiments it may be that the AMOX module is a subset of the SCR module located at a downstream end of the SCR module.

The emissions cleaning module 1 may comprise one or more sensors for sensing one or more conditions in the emissions cleaning module 1, such as temperature or quantity of $NO_x$. The sensors may comprise a sensor probe assembly 10a, 10b, 10c and remote circuitry. The sensor probe assembly 10a, 10b, 10c may comprise (a) a sensor probe at a first end of the sensor probe assembly 10a, 10b, 10c located within one of the conduits 10, 20, 30 and (b) a communications apparatus (i.e. an RF transmitter) located at a second end of the sensor probe assembly for communicating with the remote circuitry. In this way, each sensor probe assembly 10a, 10b, 10c may penetrate a conduit 10, 20, 30 of the emissions cleaning module such that those elements of the sensor probe assembly which need not be located within a volume to be sensed may be located on an exterior surface of the conduit 10, 20, 30. In this manner, sensitive elements of the sensor probe assemblies can be located away from high temperatures likely to occur inside the conduit.

The remote circuitry may be located on a component mount 140, described in more detail below. The remote circuitry may be arranged on the component mount 140 proximate the aperture of the first or second brace and distributed in a fashion which is diagonal to a line parallel to the elongate axis of the first, second and third conduits. This may allow for increased air flow so as to reduce damage to the remote circuitry which might otherwise be caused due to heat. At the same time, the regions of the brace surrounding the aperture may provide some protection from potential mechanical damage to the remote circuitry.

Figure 4:
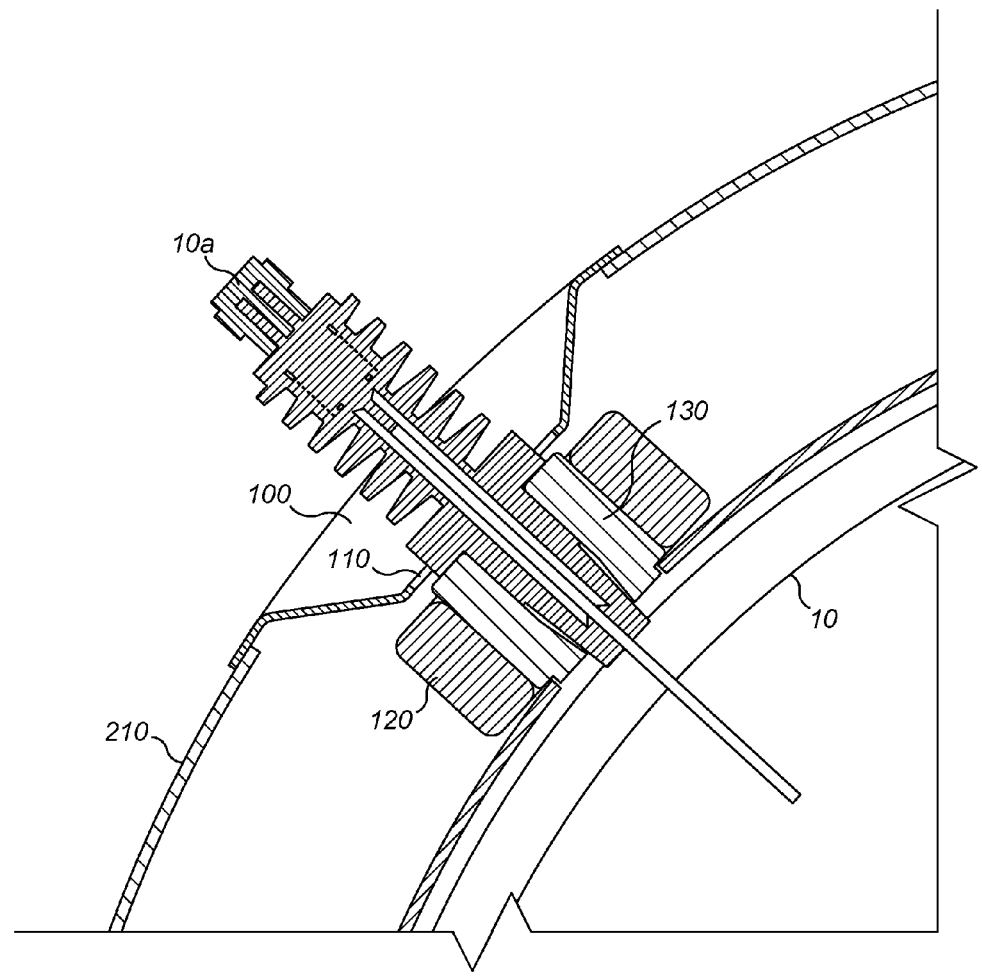
FIG. 4 shows a sensor probe assembly mounted in the emissions cleaning module of FIG. 1.
Figure 5:
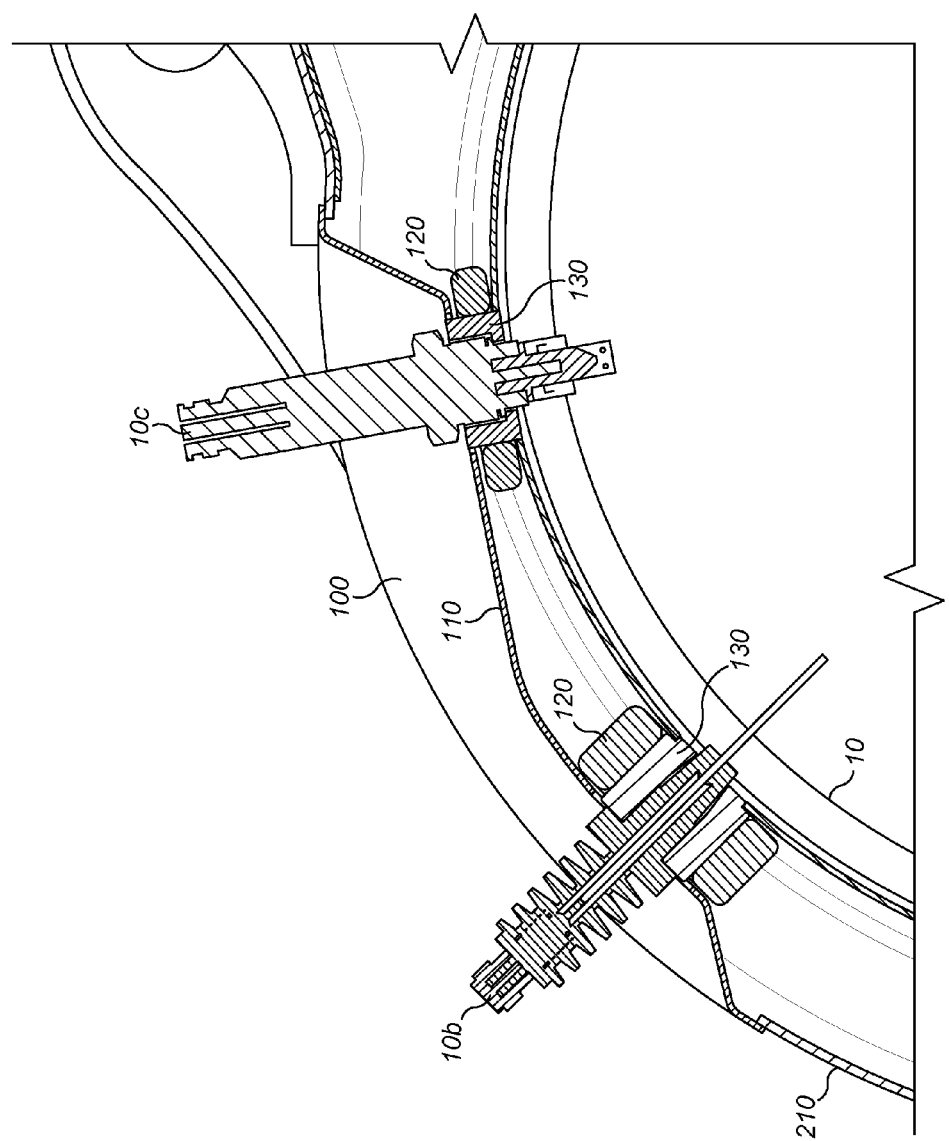
FIG. 5 shows two sensor probe assemblies mounted in the emissions cleaning module of FIG. 1.
Figure 6:
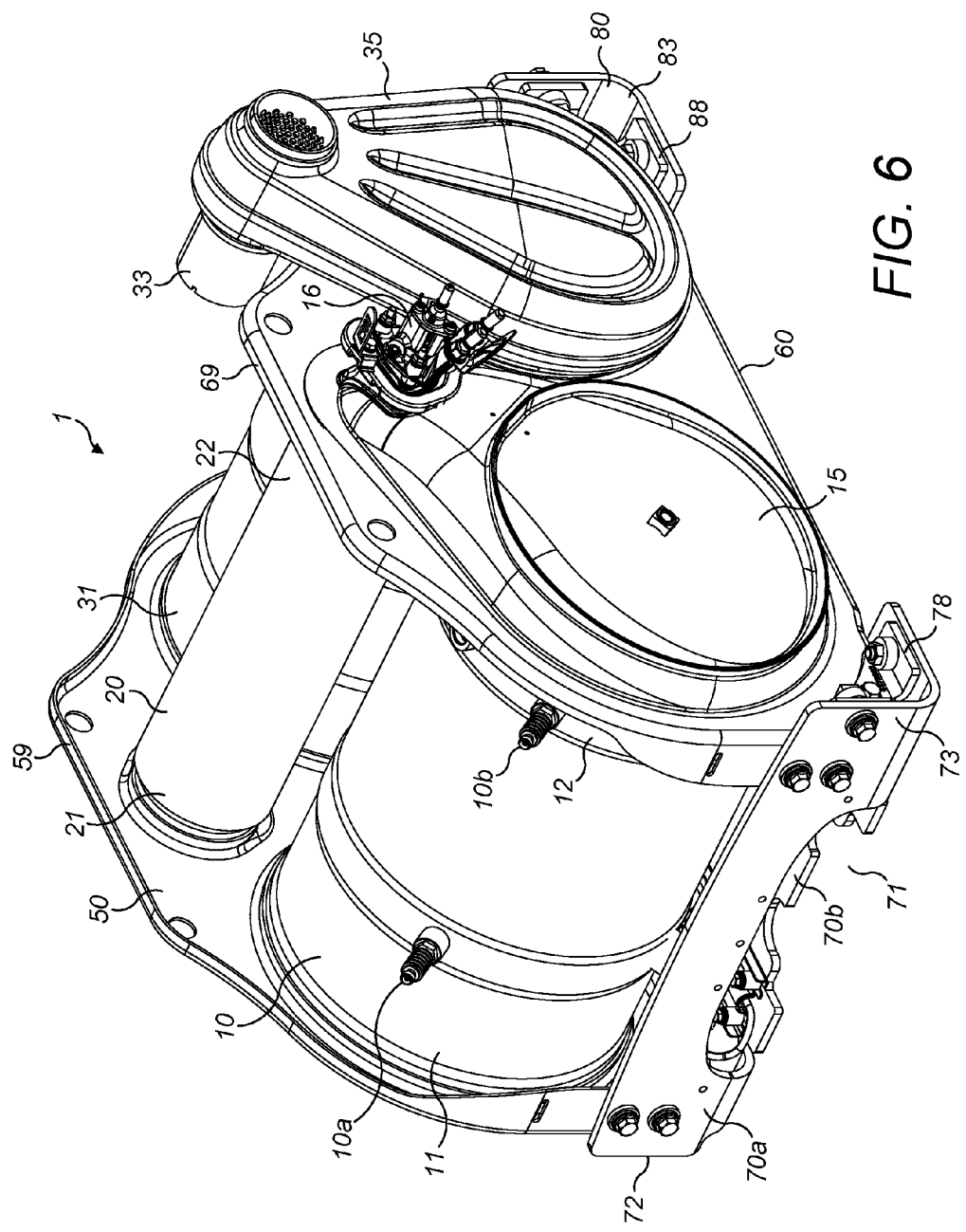
FIG. 6 shows an emissions cleaning module in accordance with a second embodiment of the disclosure.

One sensor probe assembly 10a, as shown in FIG. 4, or a plurality of sensor probe assemblies 10b, 10c, as shown in FIG. 5, may be mounted within a recess 100 of an exterior of the conduit 10. (Of course, it may be that sensor probe assemblies are mounted on any of the conduits 10, 20, 30, the first end coupling 15, the second end coupling 25, the output housing 35 or elsewhere.) An exterior profile 110 of the recess 100 may such that any fluid which falls into the recess 100 will tend to move out of the recess 100 as a consequence of gravity. This might be achieved by the exterior profile 110 of the recess 100 being monotonically decreasing towards a lowest point, when the conduit is in an upright position. By monotonically decreasing, it may be meant that the recess 100 includes no local low points but rather that the recess 100 comprises a single high point from which, and a single low point towards which, fluid may flow under gravity. There may be no local low points in the recess 100 which might otherwise act as a reservoir for fluid which could not escape from the recess 100 under gravity.

In addition, to protect sensitive features of the sensor probe assemblies 10a, 10b, 10c located on the exterior of the conduit 10, 20, 30, the sensor probe assemblies 10a, 10b, 10c may be mounted in a double O-ring structure 120, 130 so as to restrict convection of heat in a region between the interior surface of the exterior profile 110 of the recess 100 and an exterior surface of the conduit 10. The double O-ring structure 120, 130 may also reduce the likelihood of debris collecting between an exterior surface of the conduit 10 and an interior surface of the upper portion heat shield 210 (described in more detail below). The double O-ring structure 120, 130 may have a compressible construction so as to allow for one or more of expansion, contraction and tolerance compensation.

In use, fluid may be supplied to the emissions cleaning module 1 via the input housing 4. Fluid may pass into the DOC module in the first portion of the first conduit 10. Prior to receipt at the input housing 4, the pressure of the fluid may be controlled by a back pressure valve or a turbo waste gate.

The DOC module may comprise one or more catalysts, such as palladium or platinum. These materials serve as catalysts to cause oxidation of hydrocarbons ([HC]) and carbon monoxide (CO) present in the fluid flow in order to produce carbon dioxide ($CO_2$) and water ($H_2O$). The catalysts may be distributed in a manner so as to maximise the surface area of catalyst material in order to increase effectiveness of the catalyst in catalysing reactions.

Fluid may flow from the DOC module to the DPF module which comprises features which are intended to prevent onward passage of carbon (C) in the form of soot. Carbon particles in the fluid may thus trapped in the filter. The filter may be regenerated through known regeneration techniques. These techniques may involve controlling one or more of the temperature of the fluid, the pressure of the fluid and the proportion of unburnt fuel in the fluid.

Fluid may pass from the DOC module into the injector module 16 located within the first end coupling 15. The injector module 16 may be associated with or attachable to a pump electronic tank unit (PETU). The pump electronic tank unit may comprise a tank for providing a reservoir for fluid to be injected by the injector. Such fluids may include urea or ammonia. The tank may comprise a lower portion having a first cross sectional area and an upper portion having a second cross sectional area. The second cross sectional area may be smaller than the first cross sectional area. The difference in cross sectional area between the first and second portions may provide for a volume to house additional components of the PETU.

The PETU may further comprise a controller configured to control a volume of fluid to be injected from the tank by the injector. The controller may have as inputs, for example, temperature information and quantity of $NO_x$ information which may be derived from sensors in the SCR module.

Fluid may pass from the injector module 16 into the mixer module located in the second conduit 20. The mixer module may comprise features for ensuring that the fluid originating from the first conduit 10 is well mixed with the fluid originating from the injector module 16.

Fluid may pass from the injector module 16 into the SCR module located in the first portion of the third conduit via the second end coupling 25. The SCR module may comprise one or more catalysts through which the mixture of exhaust gas and urea/ammonia may flow. As the mixture passes over the surfaces of the catalyst a reaction may occur which converts the ammonia and $NO_x$ to diatomic nitrogen ($N_2$) and water ($H_2O$).

Fluid may pass from the SCR module to the AMOX module located in the second portion of the third conduit 30. The AMOX module may comprise an oxidation catalyst which may cause residual ammonia present in the fluid exiting the SCR module to react to produce nitrogen ($N_2$) and water ($H_2O$).

Fluid may pass from the AMOX module to the emissions cleaning module outlet located at the second end 32 of the third conduit 30.

FIGS. 6 to 25 show a second embodiment of an emissions cleaning module 1 according to the present disclosure. Like reference numerals are used to indicate like components as between the first and second embodiments. Detailed description of like components will not be repeated in respect of the second embodiment except to describe differences by comparison with the first embodiment.

Figure 7:
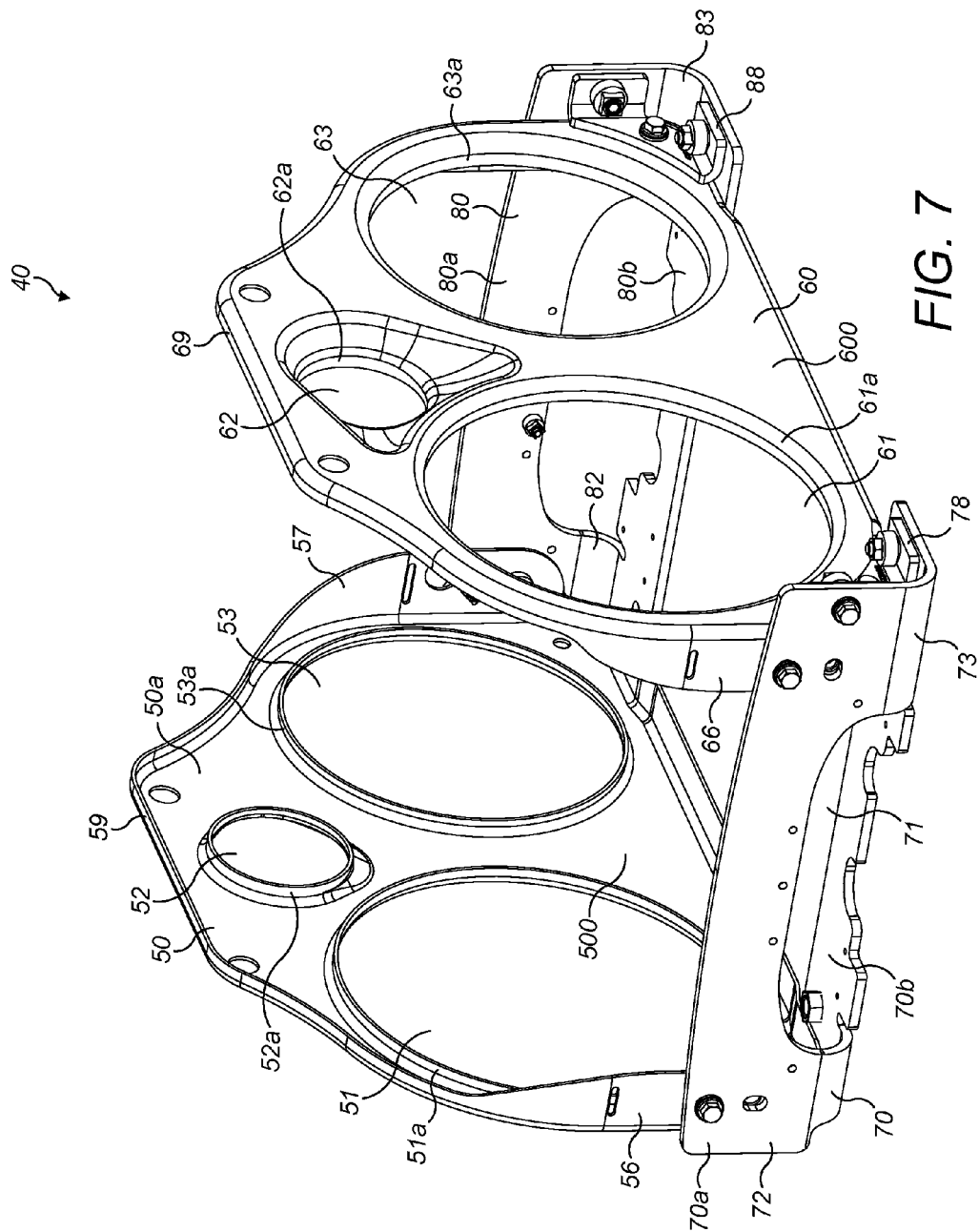
FIG. 7 shows a mounting arrangement attached to part of the emissions cleaning module shown in FIG. 6.
Figure 8:
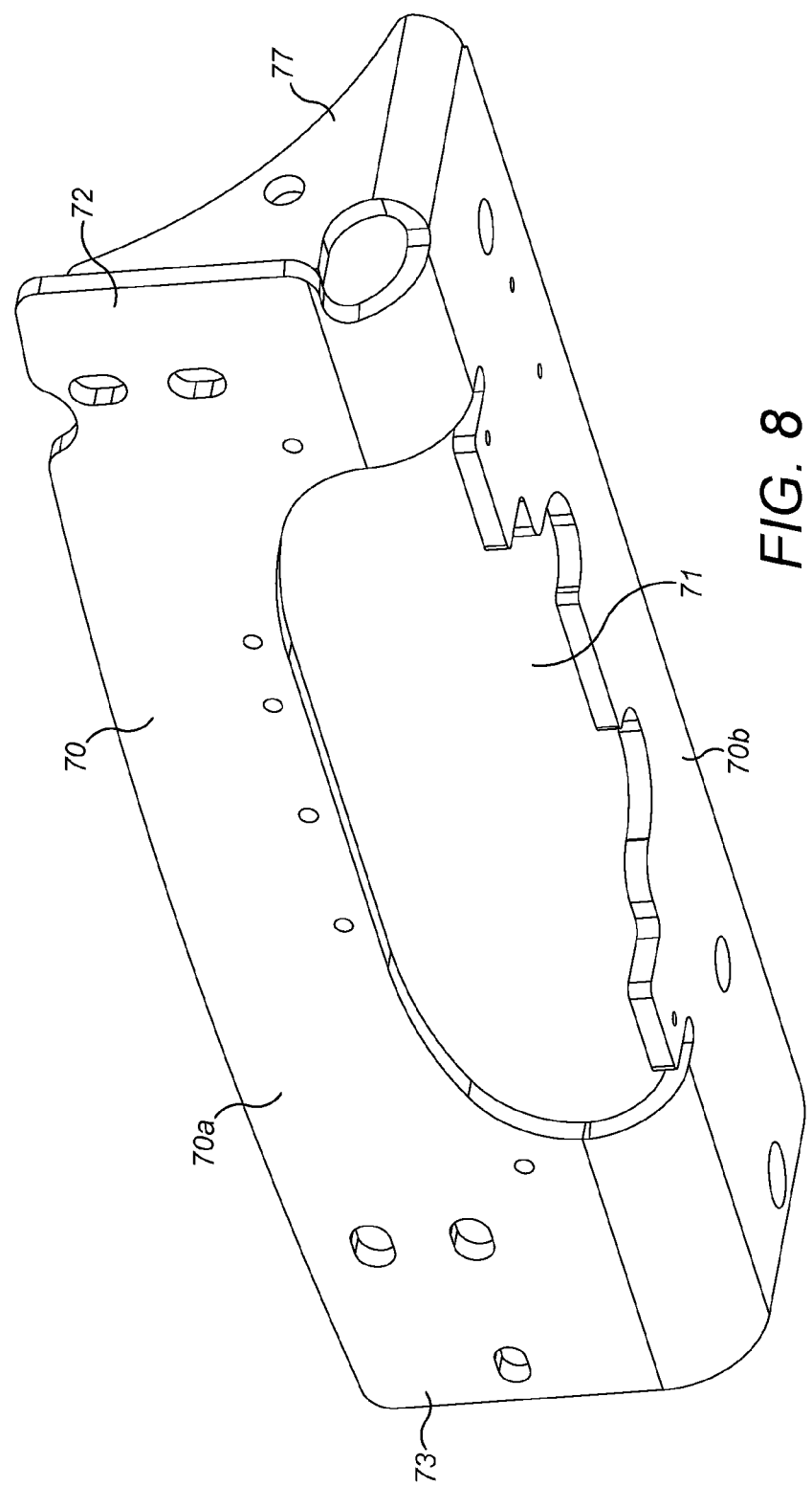
FIG. 8 shows a mounting member of the emissions cleaning module of FIG. 6.
Figure 9:
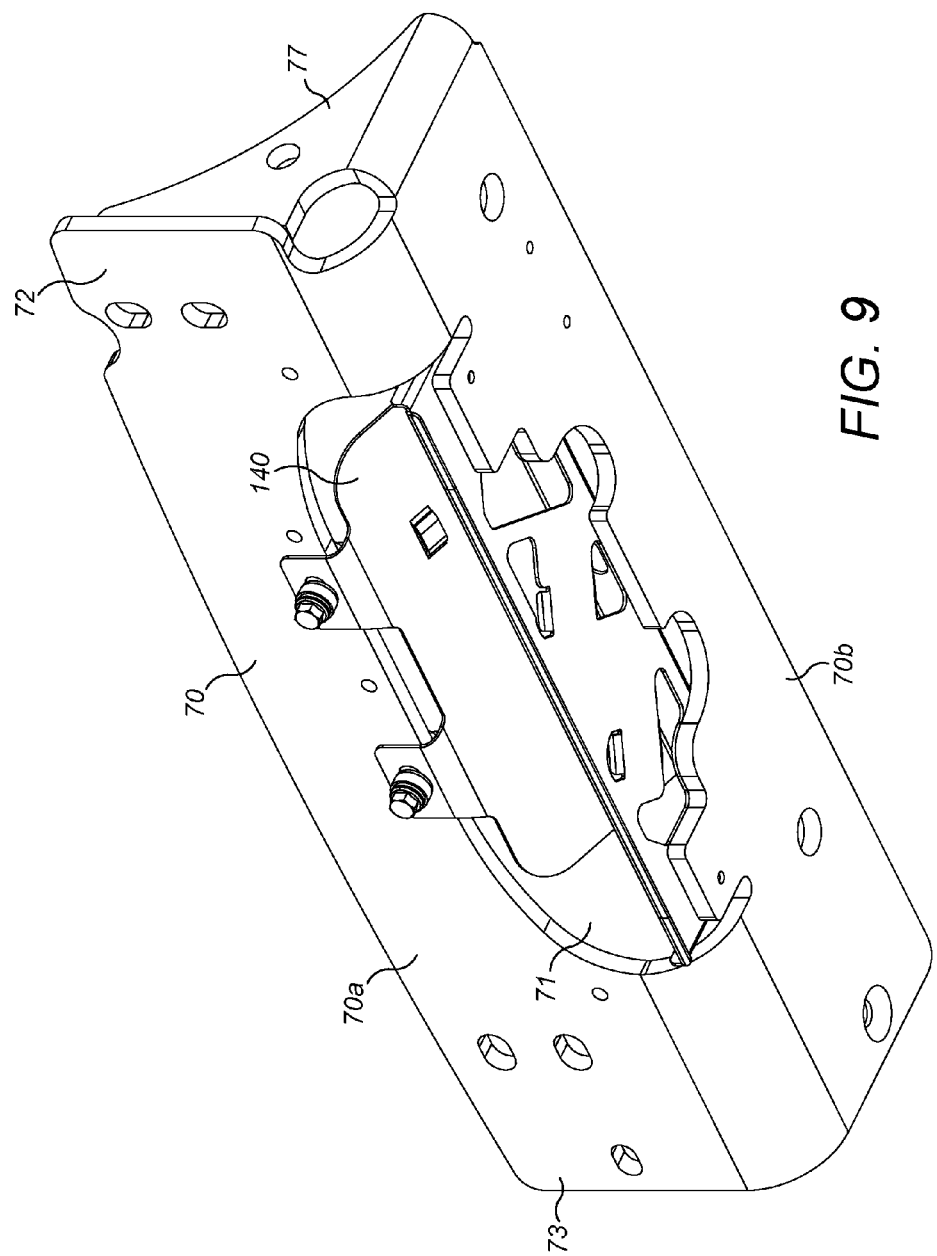
FIG. 9 shows a component mount attached to the mounting member of FIG. 8 of the emissions cleaning module of FIG. 6.
Figure 10:
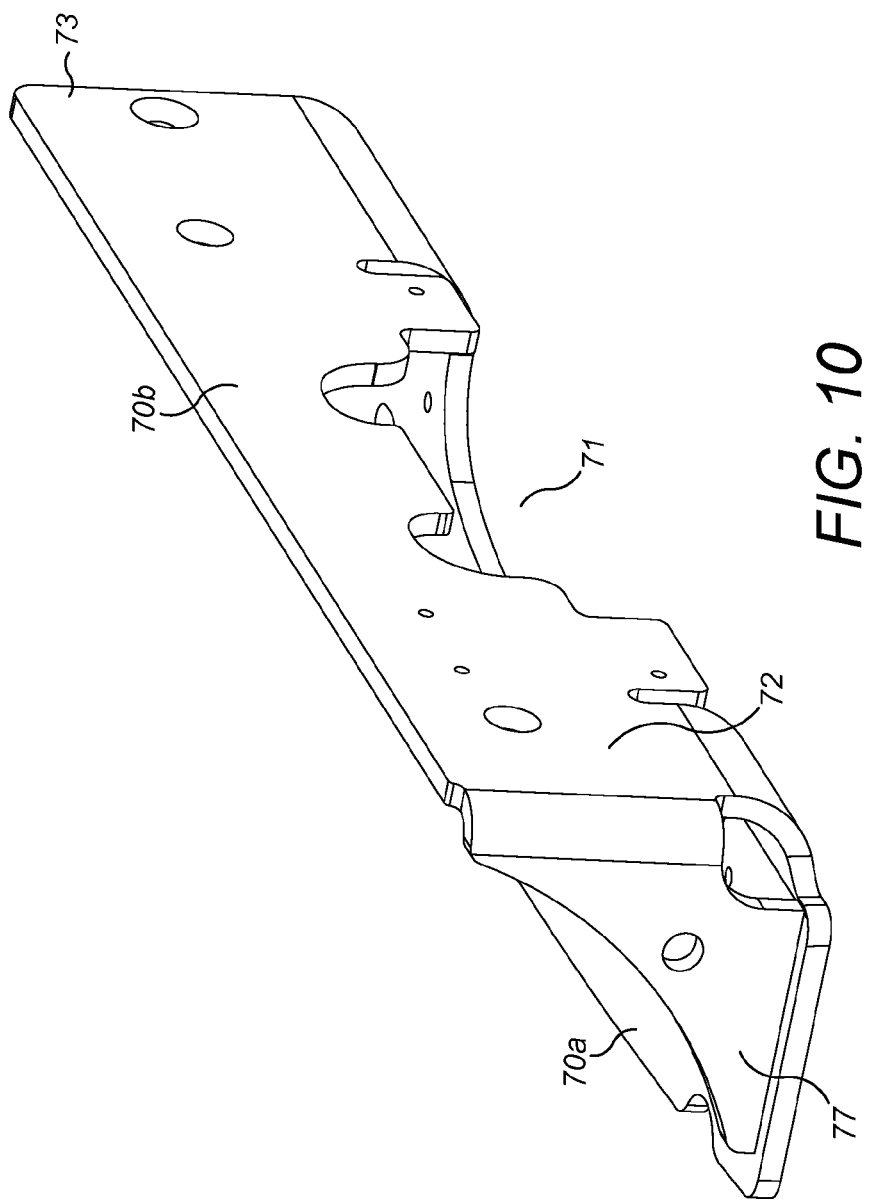
FIG. 10 shows the mounting member of FIG. 8 from an end view.
Figure 11:
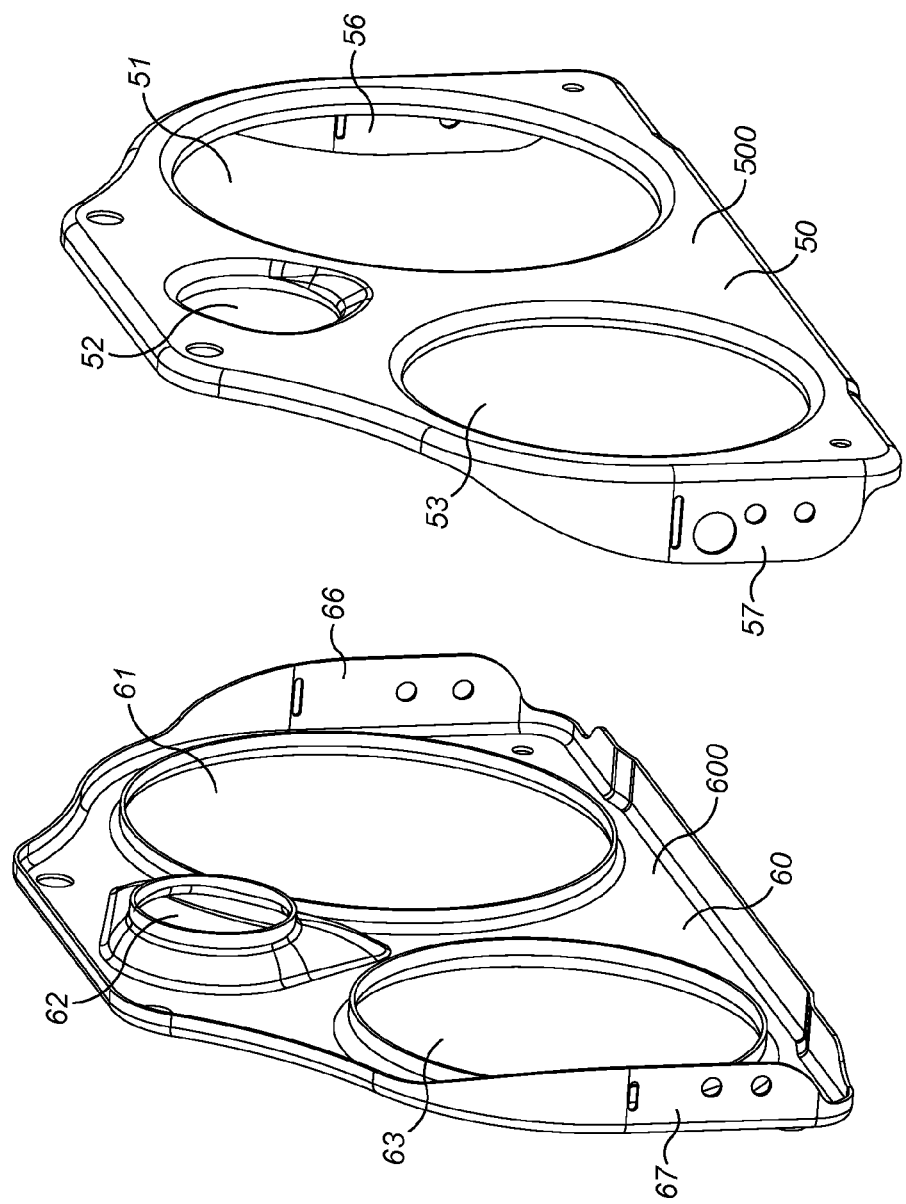
FIG. 11 shows two support members of the emissions cleaning module of FIG. 6.

The second embodiment of the emissions cleaning module 1 comprises the same fundamental structure as the first embodiment. This is clear from a comparison of FIG. 6 (second embodiment) with FIG. 1 (first embodiment). In short, the emissions cleaning module 1 comprises a first conduit 10, a second conduit 20, a third conduit 30, and a mounting arrangement 40. The mounting arrangement 40, is illustrated in FIG. 7, and may comprise first and second braces attached to a first support member 50 and a second support member 60 of the emissions cleaning module, as shown in FIG. 11.

The first support member 50 may comprise a first flange 56 and a second flange 57. The first flange 56 and the second flange 57 may each be substantially perpendicular to first support member plane 500. As such, the first flange 56 and the second flange 57 may each be substantially parallel to an axial direction of the first conduit 10, the second conduit 20 and the third conduit 30.

The first flange 56 may be parallel to the vertical portion 70a of the first L-shaped brace 70 and located such that an exterior face of the first flange 56 is adjacent an interior face of the vertical portion 70a of the first brace 70. One or more apertures may be provided in the first flange 56 to correspond with one or more apertures in the vertical portion 70a of the brace 70 in order to allow fastening means to connect the first flange 56 to the brace 70.

The second flange 57 may be parallel to the vertical portion 80a of the second L-shaped brace 80 and located such that an exterior face of the second flange 57 is adjacent an interior face of the vertical portion 80a of the second brace 80. One or more apertures may be provided in the second flange 57 to correspond with one or more apertures in the vertical portion 80a of the second brace 80 in order to allow fastening means to connect the second flange 57 to the second brace 80.

The second support member 60 may comprise a first flange 66 and a second flange 67. The first flange 66 and the second flange 67 may each be substantially perpendicular to the second support member plane 600. As such, the first flange 66 and the second flange 67 may each be substantially parallel to an axial direction of the first conduit 10, the second conduit 20 and the third conduit 30.

As with the first support member, the first flange 66 may be parallel to the vertical portion 70a of the first L-shaped brace 70 and located such that an exterior face of the first flange 66 is adjacent an interior face of the vertical portion 70a of the first brace 70. One or more apertures may be provided in the first flange 66 to correspond with one or more apertures in the vertical portion 70a of the first brace 70 in order to allow fastening means to connect the first flange 66 to the first brace 70.

The second flange 67 may be parallel to the vertical portion 80a of the second L-shaped brace 80 and located such that an exterior face of the second flange 67 is adjacent an interior face of the vertical portion 80a of the second brace 80. One or more apertures may be provided in the second flange 67 to correspond with one or more apertures in the vertical portion 80a of the second brace 80 in order to allow fastening means to connect the second flange 67 to the second brace 80.

As stated above, in the first embodiment of the clean emissions module the vertical portion 70a and horizontal portion 70b of the first brace 70 are connected at each of the first end 72 and the second end 73 by an independent clip 78 fastened to each of the vertical portion 70a and horizontal portion 70b (and, similarly, the vertical portion 80a and horizontal portion 80b of the second brace 80 are connected at each of the first end 82 and the second end 83 by an independent clip 88 fastened to each of the vertical portion 80a and horizontal portion 80b). In the second embodiment of the clean emissions module such a clip is used only at the second end 73 of the first brace (and the second end 83 of the second brace).

Instead of clip 78 at the first end 72 of the first brace 70, in the second embodiment of the clean emissions module an extension 77 at the first end 72 of the horizontal portion 70b of the first brace 70 is bent upwards from the horizontal plane to the vertical plane so as to be perpendicular to the vertical portion 70a of the first brace 70. This is seen most clearly in FIGS. 8 to 10. A side face of the extension 77 of the first brace 70 is located immediately adjacent an inner surface of the vertical portion 70a of the first brace 70.

Similarly, an extension 87 at the first end 82 of the horizontal portion 80b of the second brace 80 is bent upwards from the horizontal plane to the vertical plane so as to be perpendicular to the vertical portion 80a of the second brace 80. A side face of the extension 87 of the second brace 80 is located immediately adjacent an inner surface of the vertical portion 80a of the second brace 80.

A component mount 140 may be located in each of the apertures 71, 81 of the first and second braces 70, 80. Each component mount 140 may be separate from but connected to each brace in order to allow freer flow of ambient gas around components which may be fastened to each component mount 140. Furthermore, each component mount 140 may itself comprise one or more apertures to allow freer flow of ambient gas. Freer flow of ambient gas may conduct heat away from components (i.e. electronic components) fastened to the component mount 140 which may thereby increase reliability.

Figure 13:
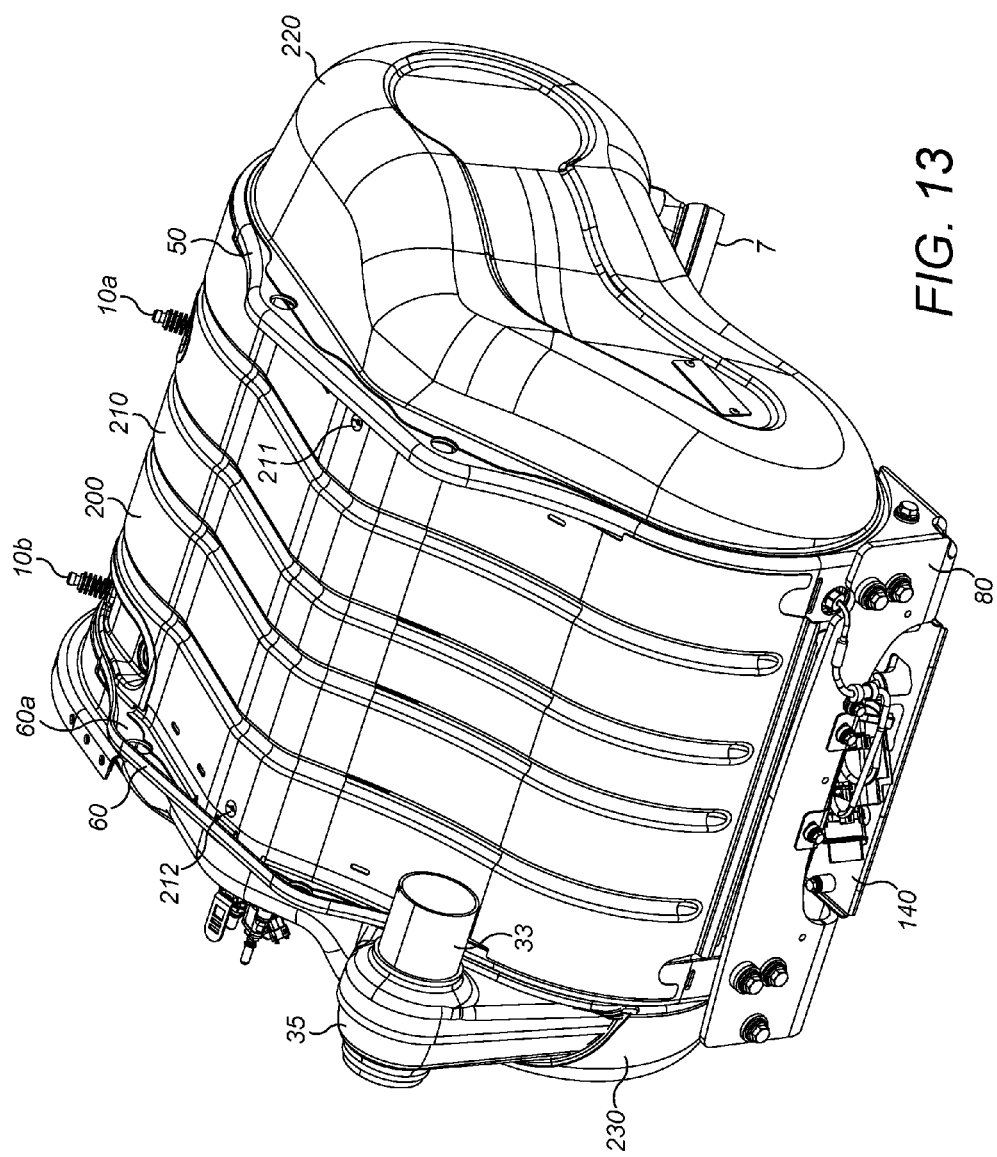
FIG. 13 shows the emissions cleaning module of FIG. 6 from an opposite orientation and including heat shielding.
Figure 14:
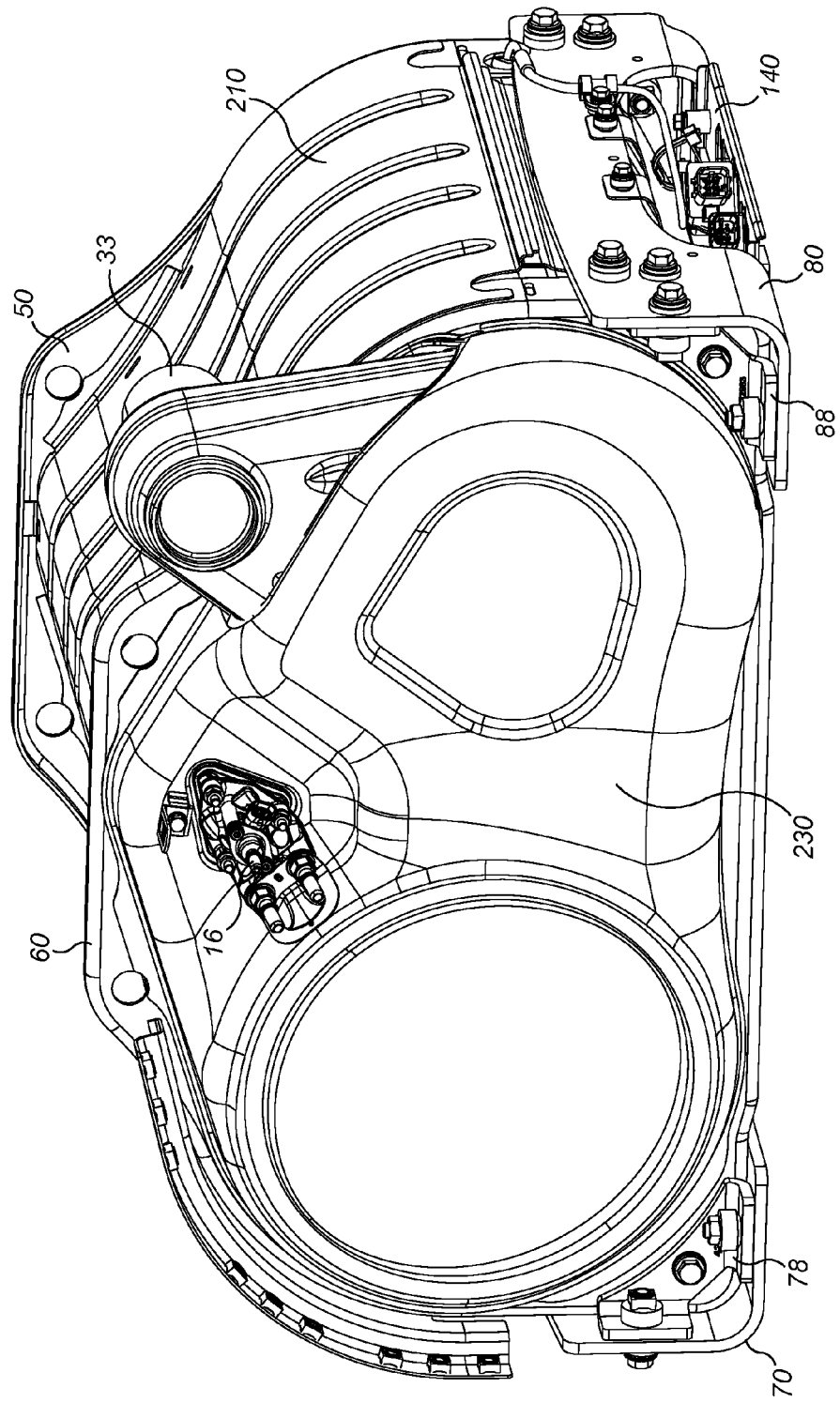
FIG. 14 shows the emissions cleaning module of FIG. 6 when viewed from one end.
Figure 15:
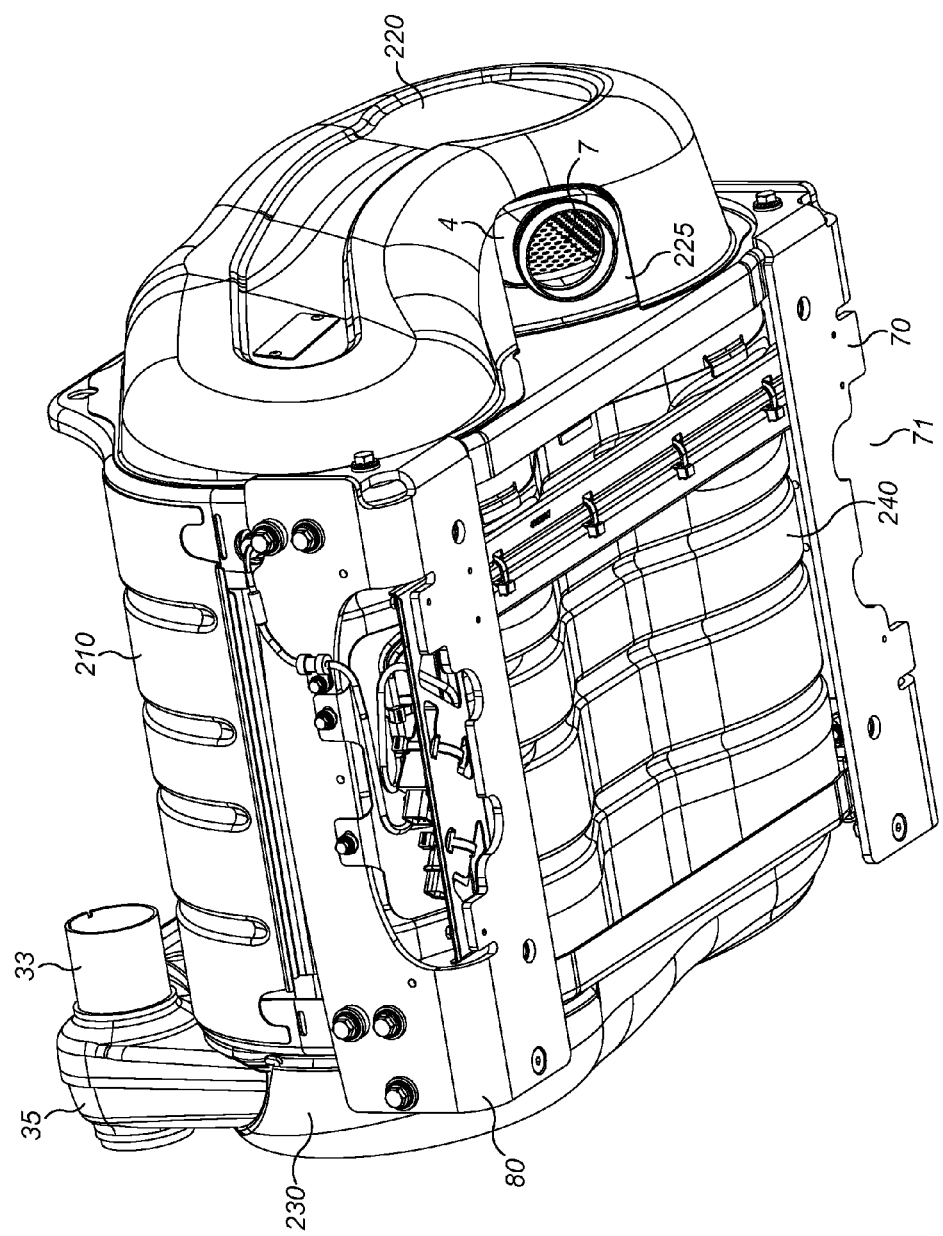
FIG. 15 shows the emissions cleaning module of FIG. 6 when viewed from beneath.
Figure 16:
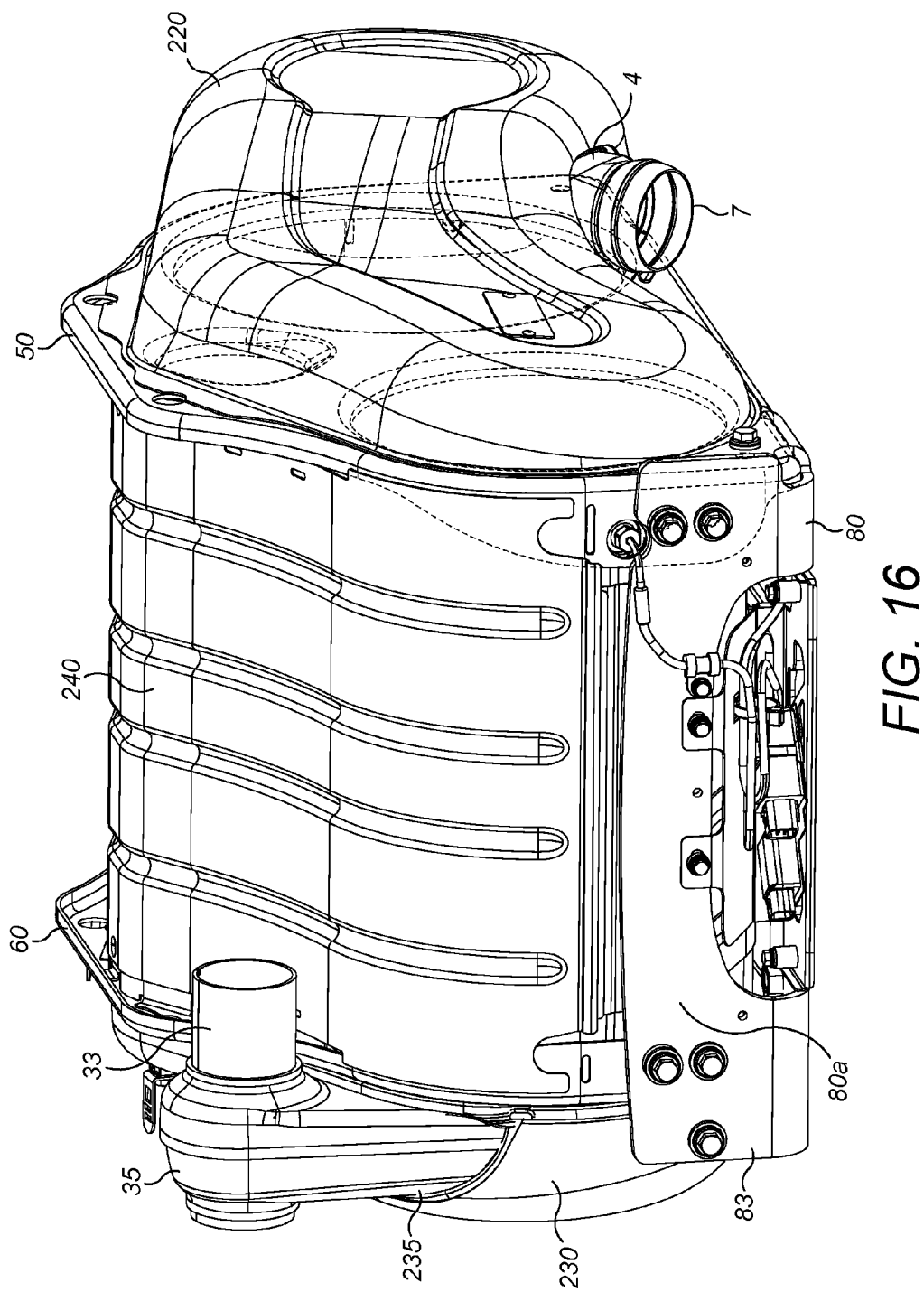
FIG. 16 shows the emissions cleaning module of FIG. 6 wherein the first support member 50 is shown in dotted lines beneath other components.
Figure 17:
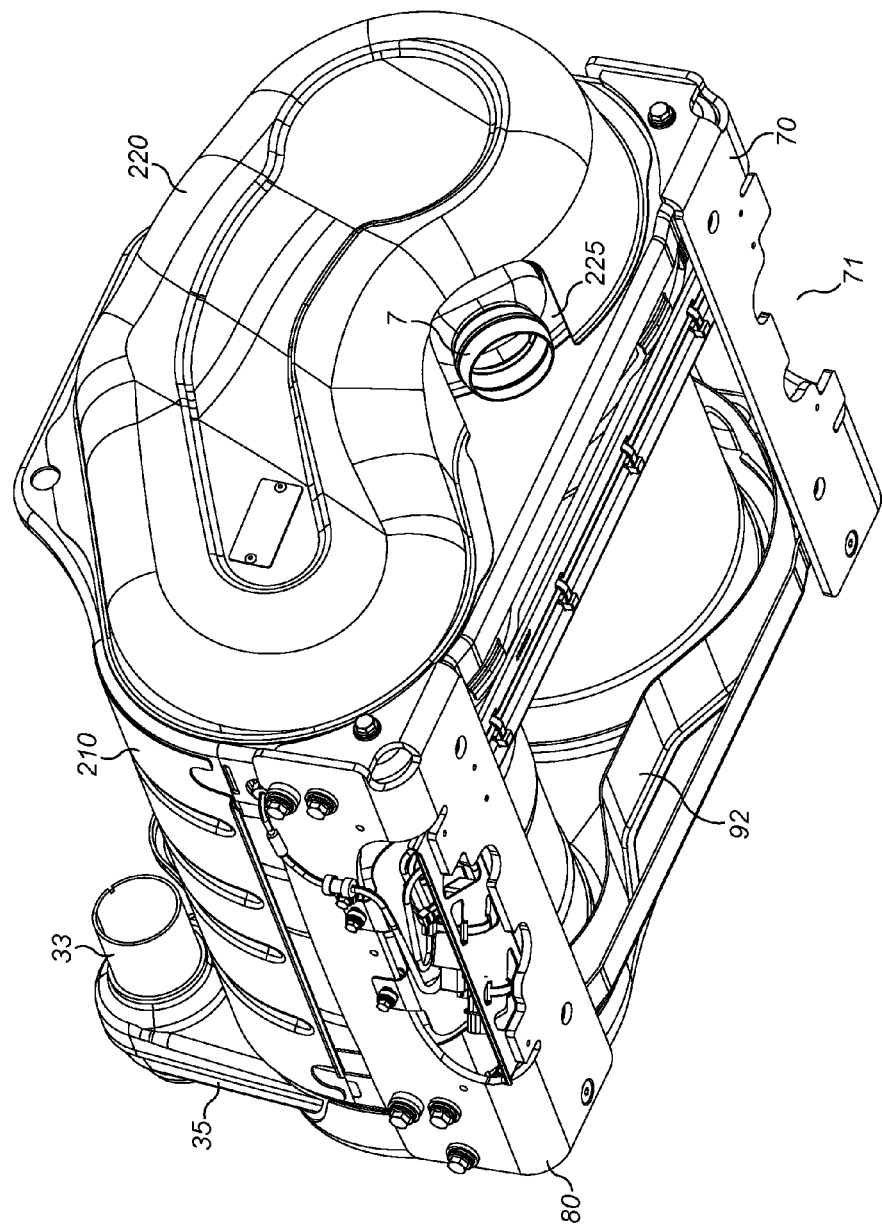
FIG. 17 shows the emissions cleaning module of FIG. 6 from beneath.

The emissions cleaning module may comprise external heat shielding 200. FIGS. 13 to 15 show the second embodiment of the emissions cleaning module including external heat shielding 200. The heat shielding may also be a feature of the emissions cleaning module of the first embodiment, even though there is no figure showing the emissions cleaning module of the first embodiment having heat shielding.

Figure 12:
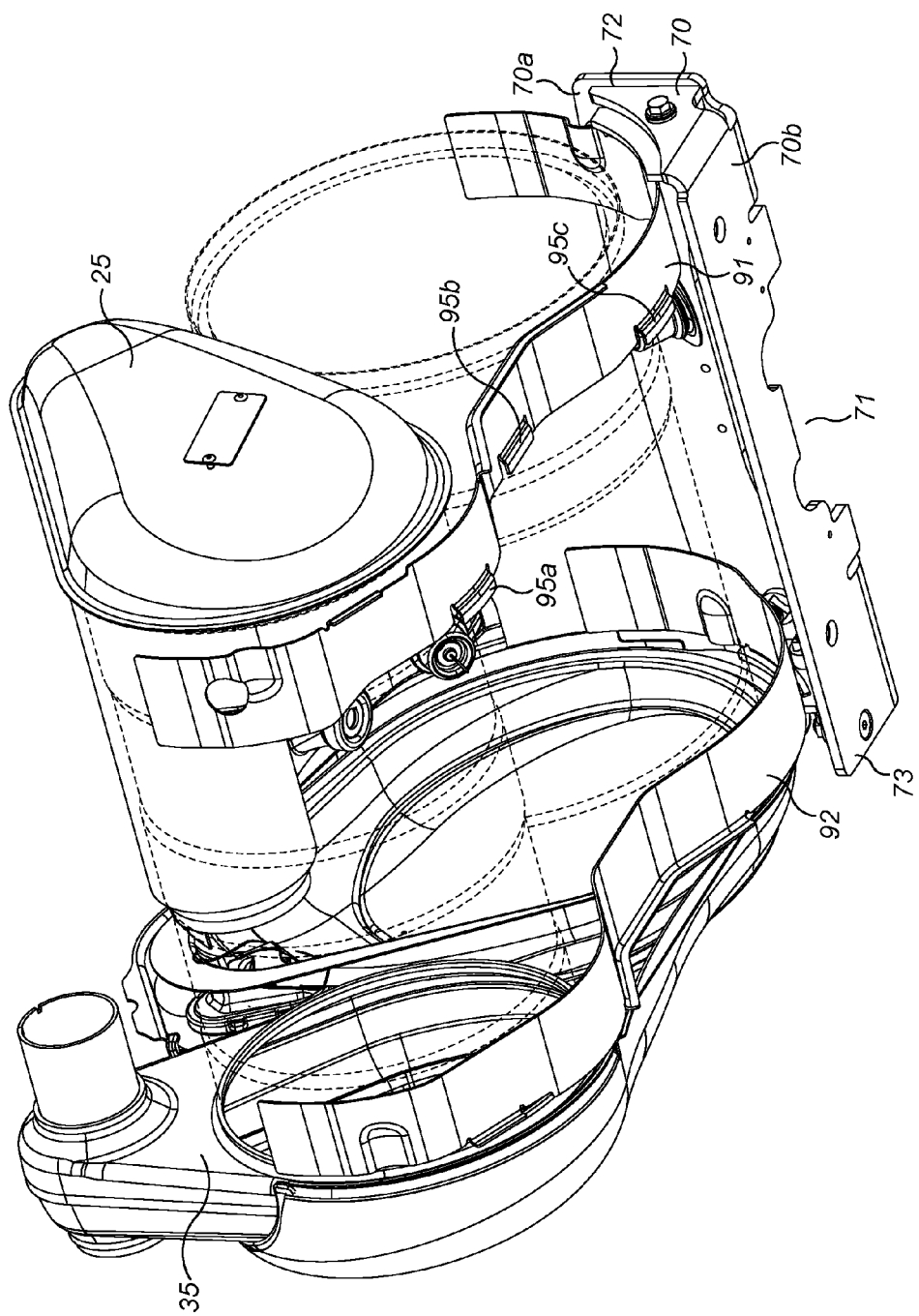
FIG. 12 shows the emissions cleaning module of FIG. 6 from beneath with some of the components shown in broken lines.

The emissions cleaning module may further comprise a first heat shield bracket 91 and a second heat shield bracket 92, as best shown in FIG. 12. The first heat shield bracket 91 may be located adjacent, and may be welded to, the first support member 50. The second heat shield bracket 92 may be located adjacent, and may be welded to, the second support member 60.

The heat shielding 200 may comprise an upper portion heat shield 210 (best seen in FIG. 13), a first end heat shield 220 adjacent the first support member 50 (best seen in FIG. 13), a second end heat shield 230 adjacent the second support member 60 (best seen in FIG. 14) and a lower portion heat shield 240 (best seen in FIG. 15). The heat shielding 200 may serve the dual purpose of shielding the emissions cleaning module 1 from fluctuating external ambient temperatures so as to conserve thermal energy in the exhaust gas and shielding the immediate external environment from heat emanating from within the emissions cleaning module 1.

The heat shielding 200 may be shaped to follow the major outermost contours of those components of the emissions cleaning module which are located directly within the heat shielding 200, such as, in the case of the upper portion heat shield 210, upward facing surfaces of the first conduit 10, the second conduit 20 and the third conduit 30. Similarly, the lower portion heat shield 240 may be shaped to follow the major outermost contours of the underside of the first, second and third conduits 10, 20, 30.

The first end heat shielding 220 may be shaped to follow the major outermost contours of the components which are located on an outer side of the first support member 50. The first end heat shielding 220 may include an aperture 225 (see FIG. 15) through which a portion of the input housing 4 of the emissions cleaning module 1 may protrude.

The second end heat shielding 230 may be shaped to follow the major outermost contours of the components which are located on an outer side of the second support member 60. The second end heat shielding 230 may include an aperture 235 through which a portion of the output housing 35 may protrude. In the event that the output housing 35 may be attached to the second support member 60 in a variety of rotational positions with respect to the axis of the third conduit 30, the aperture 235 may be larger than shown in the illustrated embodiment.

The upper portion heat shield 210 may be located within the inwardly turned lip 59 of the first support member 50 and the inwardly turned lip 69 second support member 60. As shown best in FIG. 13, there may be one or more recesses 211, 212 in the upper portion heat shield 210 which align with one or more recesses in the components directly beneath, such as an exterior of the second conduit 20. Furthermore, outer features of the upper portion heat shield 210 may sit outside and immediately adjacent the flanges 56, 57, 66, 67 of the first and second support members 50, 60 and may be welded thereto. There may be similar cooperating recesses in the lower portion heat shield 240 with respect to the components directly beneath.

Turning again to FIG. 12, the first heat shield bracket 91 may comprise receiving portions 95a, 95b, 95c. The receiving portions 95a, 95b, 95c may be configured to receive and locate a first edge of the lower portion heat shield 240 such that the first edge of the lower portion heat shield 240 abuts an adjacent edge surface of the first heat shield bracket 91. The first edge surface of the lower portion heat shield 240 may be welded to the abutting edge surface of the first heat shield bracket 91.

The second heat shield bracket 92 may be located such that a second edge surface of the lower portion heat shield 240 abuts an adjacent edge surface of the second heat shield bracket 92. The second edge surface of the lower portion heat shield 240 may be welded to the abutting edge surface of the second heat shield bracket 92.

As the skilled person would readily appreciate, it may be that the receiving portions 95a, 95b, 95c are located on the second heat shield bracket 92 rather than the first heat shield bracket 91.

The emissions cleaning module may further comprise a third heat shield bracket and a fourth heat shield bracket (neither of which is readily identifiable in the Figures). The third and fourth heat shield brackets may be located adjacent, and may be welded to, the first and second support members 50, 60, respectively. While the first and second heat shield brackets 91, 92 may be located to support the lower portion heat shield 240, the third and fourth heat shield brackets may, in a corresponding manner, be located to support the upper portion heat shield 210.

Figure 18:
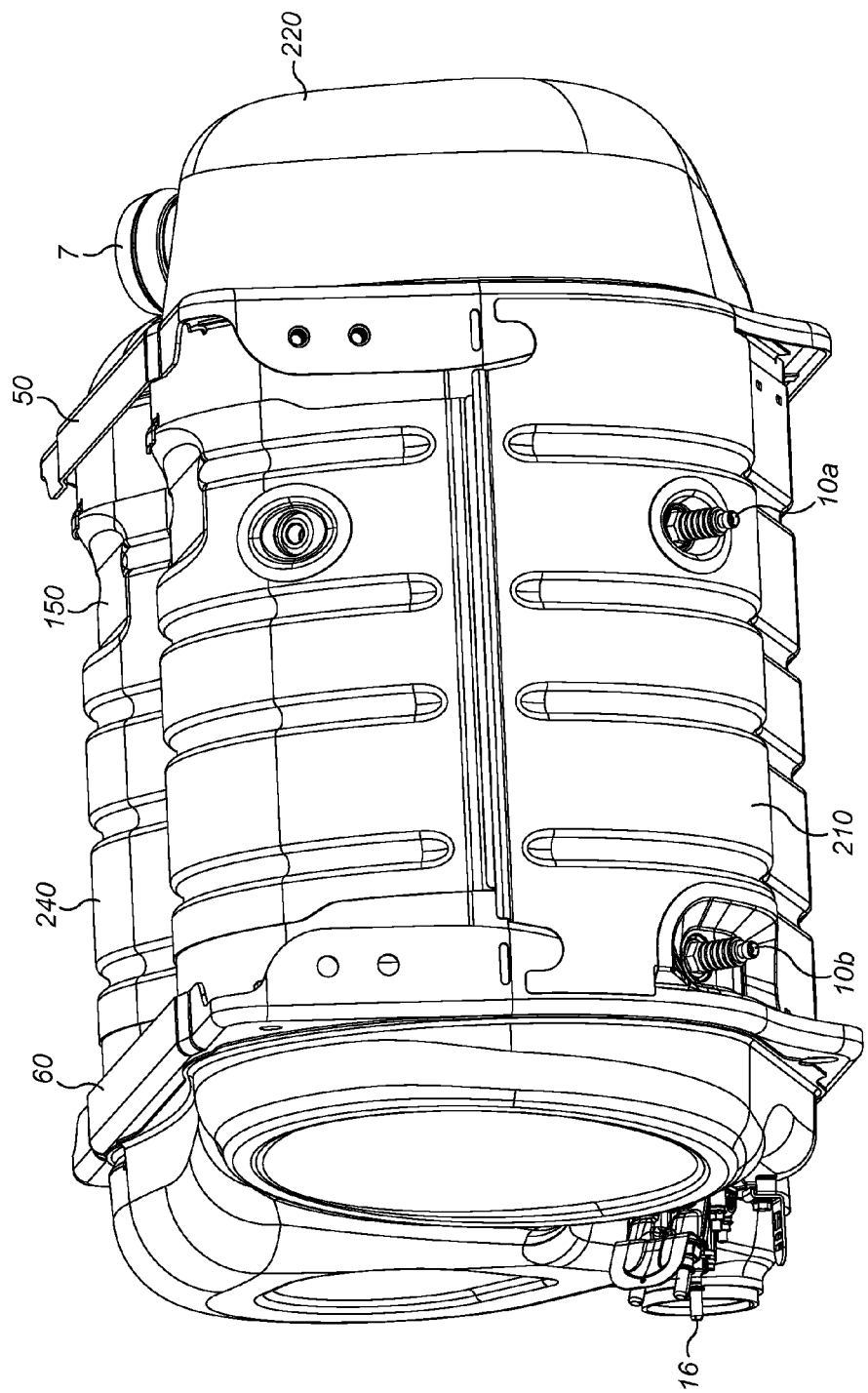
FIG. 18 shows an underside of the emissions cleaning module of FIG. 6 including heat shielding.
Figure 19:
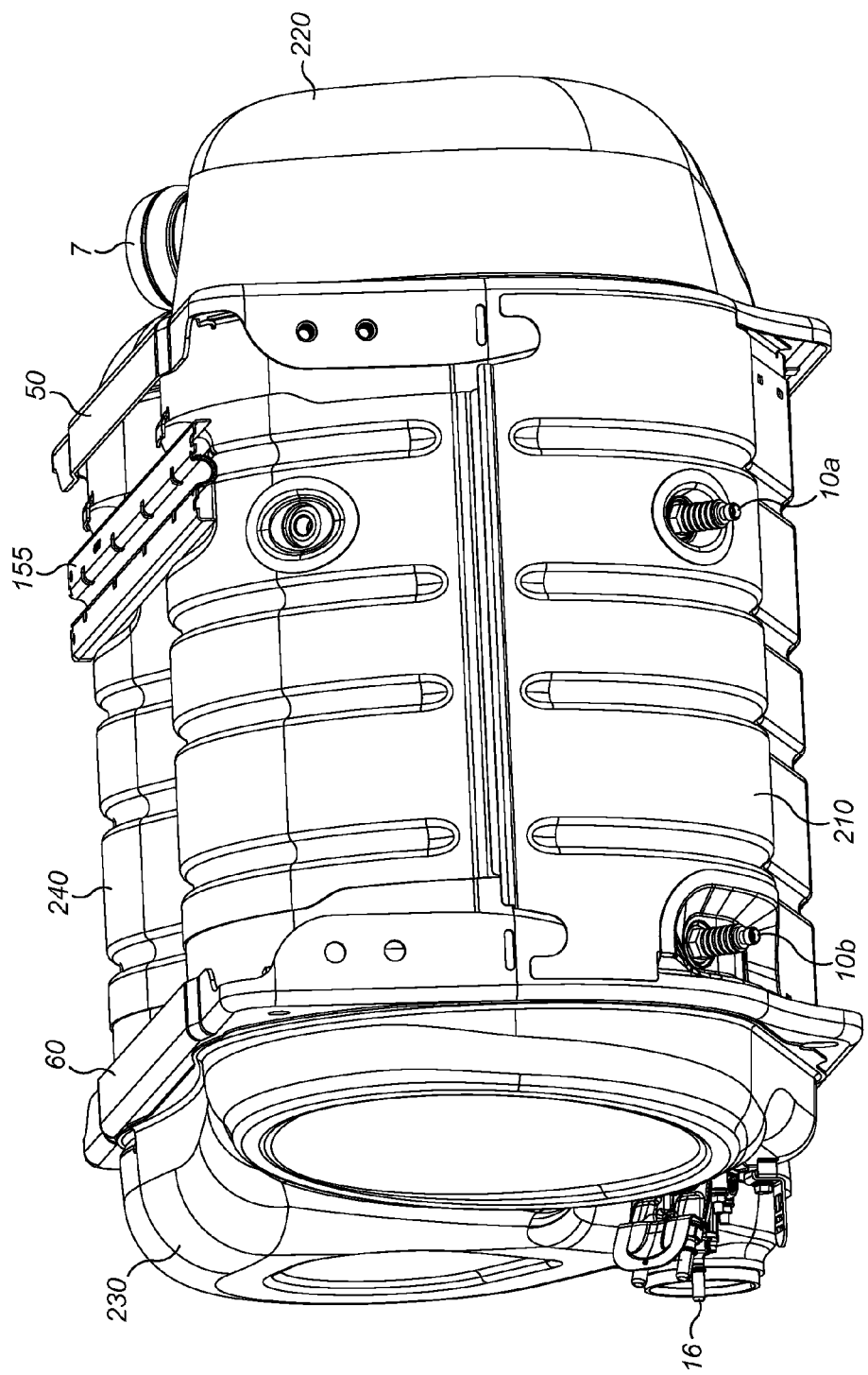
FIG. 19 shows an underside of the emissions cleaning module of FIG. 6 and including a cable conduit.

As can be seen in FIG. 18, the lower portion heat shield 240 may comprise a recess 150 in at least those lowermost features which are adjacent the first conduit 10 and the second conduit 30. A cable tray 155 may be configured to be received into the recess 150. When in position within the conduit, the cable tray 155 may be fastened at one end to the first brace 70 and at the other end to the second brace 80. When unfastened, the cable tray may be movable along the axis of the recess 150.

The cable tray 155 may be configured to receive cables which need to pass from one side to an opposite side of the emissions cleaning module. By making the cable tray 155 movable within the recess, it can be passed under the emissions cleaning module (when mounted on a machine) in a volume which would otherwise be difficult to access due to space constraints.

Figure 20:
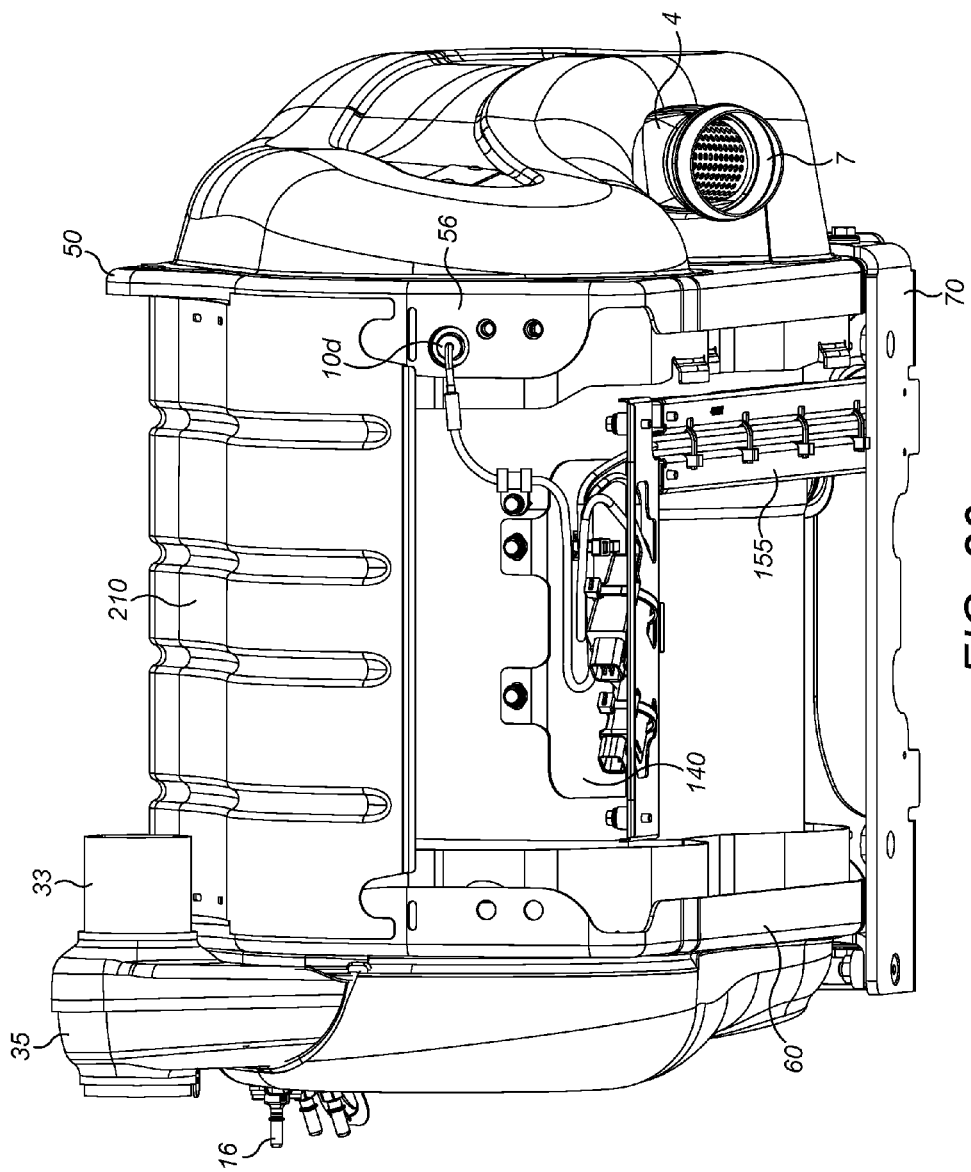
FIG. 20 shows the emissions cleaning module of FIG. 6 with some of the external features removed.
Figure 21:
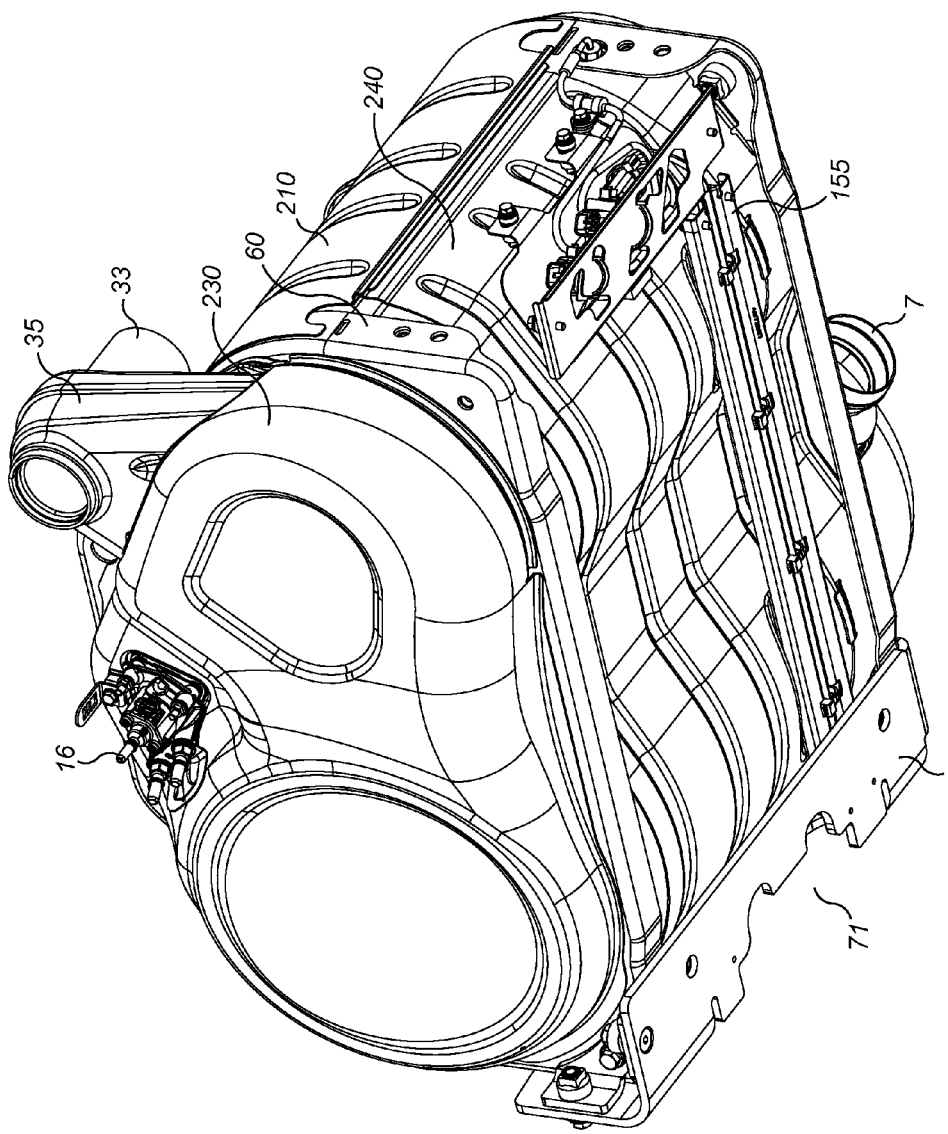
FIG. 21 shows the emissions cleaning module of FIG. 6.
Figure 22:
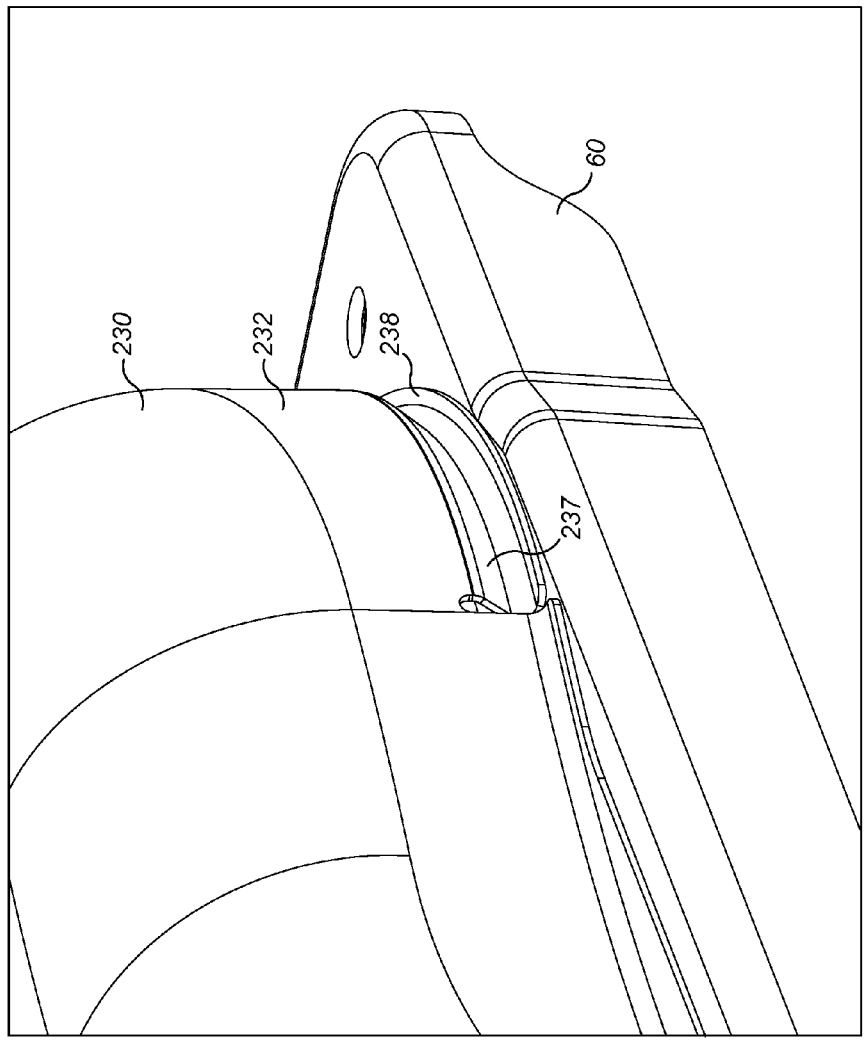
FIG. 22 shows an end portion of heat shielding of the emissions cleaning module of FIG. 6.
Figure 23:
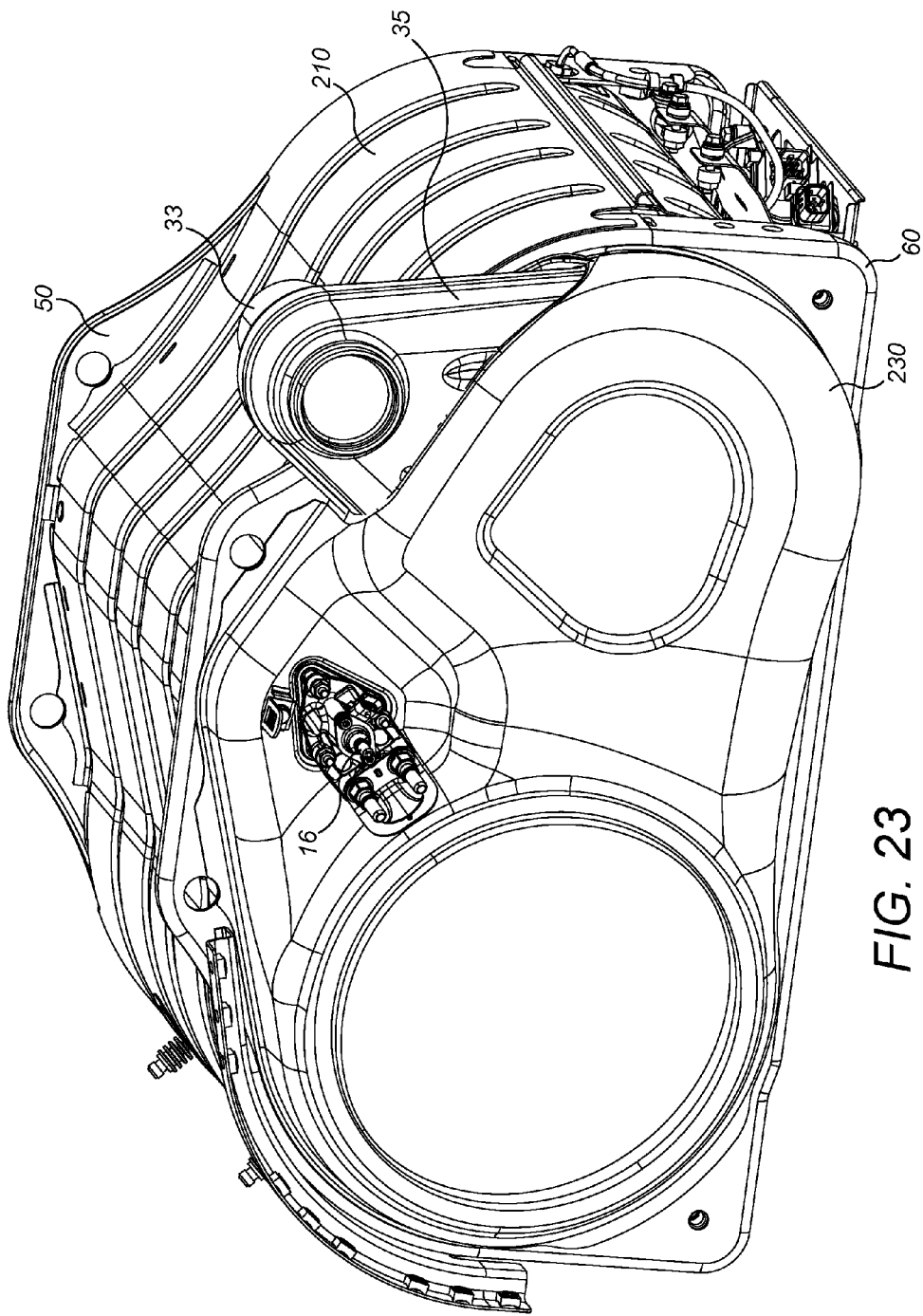
FIG. 23 shows the emissions cleaning module of FIG. 6 from one end.

FIG. 20 (from which lower portion heat shield 240 and second brace 80 are missing, for clarity) and FIG. 21 show cables mounted on the cable tray 155. These cables connect to components on the component mount 140 and to sensor probe assembly 10d which is mounted through the first support member 50. Opposite ends of the cables may mount to components on component mount 140 attached to first brace 70 or to other components.

The heat shielding 200 may be shaped in order to fulfil the following two criteria. First, in order to maximise ambient gas volume in a gap between an exterior surface of the inner components (i.e. first conduit 10, second conduit 20, third conduit 30, first end coupling 15, second end coupling 15, input housing 4, output housing 35) and an interior surface of the heat shielding 200. Secondly, in order to minimise the overall volume of the emissions cleaning module 1. This may result in maximal thermal insulation to clean emissions module size ratio.

To this end, second end heat shield 230 may be shaped such that a flange 238 by which the second end heat shield 230 may be welded to the second support member 60 may, at the widest aspect of the second end heat shield 230, be folded beneath an outermost surface 232 perpendicular to the support member 60 via an angled feature 237. This is shown clearly in FIG. 22. If the flange were not folded beneath the outermost surface 232 then the second support member 60 would need to be larger in order to provide sufficient surface onto which the flange 238 may be welded.

In a similar manner, the first end heat shield 220 may have a corresponding folded-under flange shape as the second end heat shield 230 for the same reasons.

Figure 24:
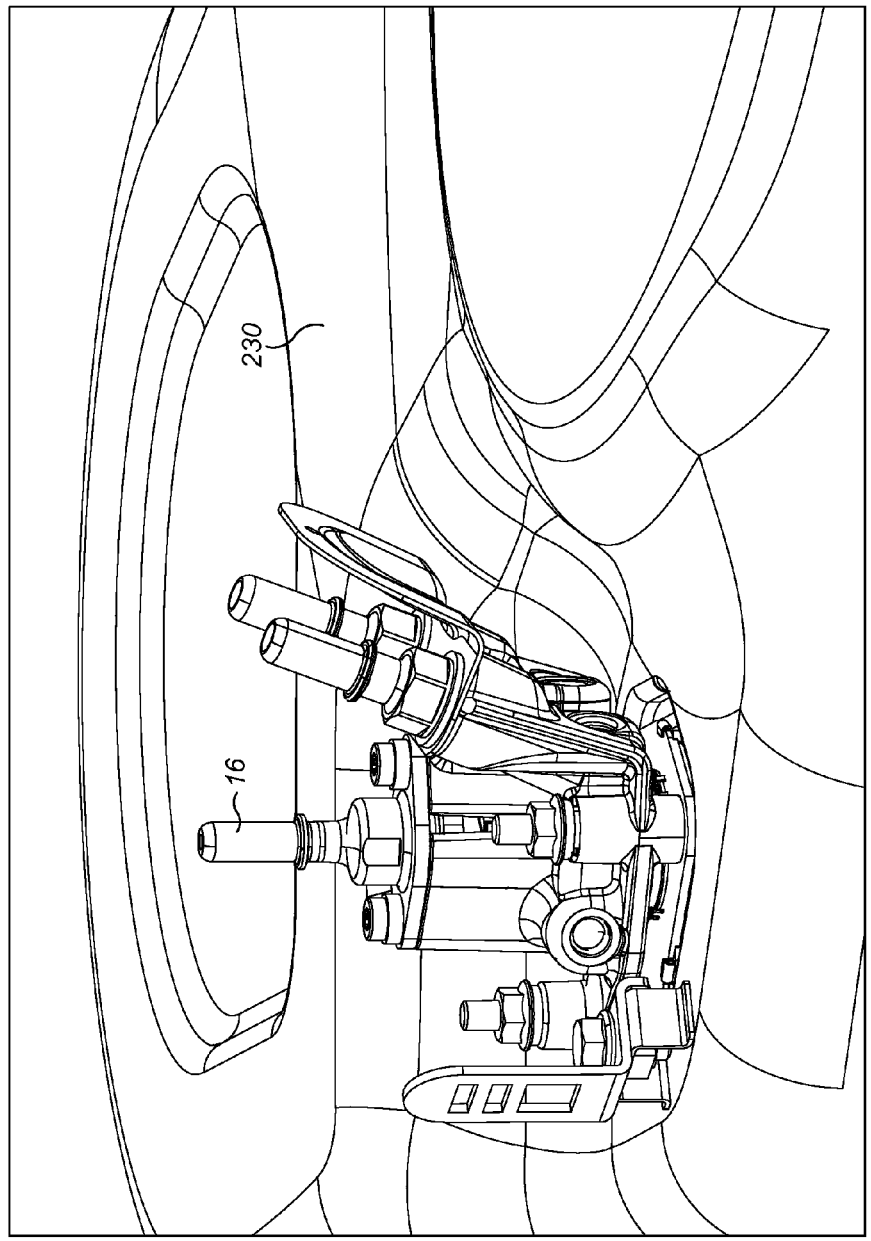
FIG. 24 shows an injector module of the emissions cleaning module of FIG. 6.
Figure 25:
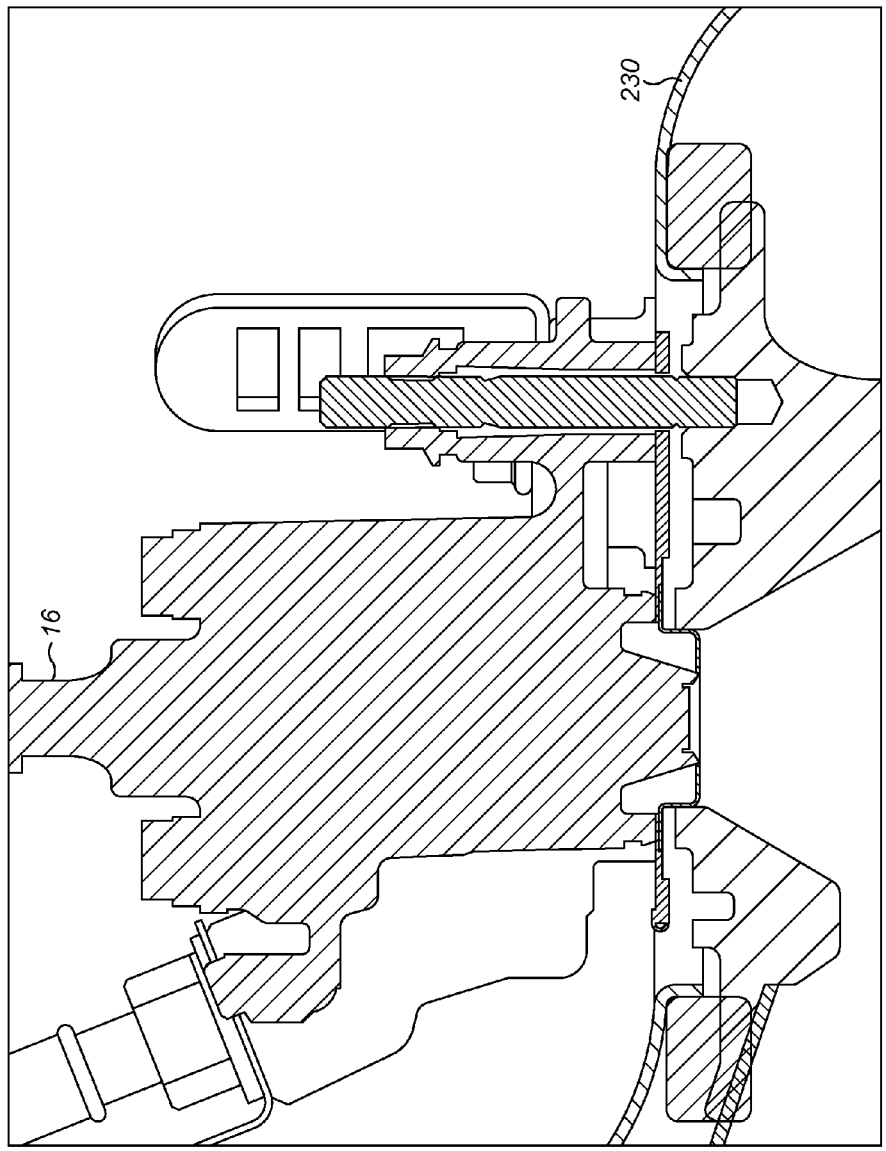
FIG. 25 shows a cross section through the injector module of the emissions cleaning module of FIG. 6.

Injector module 16 is shown, in situ, in FIGS. 24 and 25. The injector module 16 may be mounted to the second support member 60 by an arrangement of mutually aligned bosses through which fastening members may pass. The fastening members may pass through bosses on the injector module 16 into receiving portions in a bracket fastened to the first end coupling 15.

There will be many possible modifications to the illustrated embodiments which fall within the scope of the appended claims. Indeed, since the emissions cleaning module 1 may be used for a variety of applications, variations are contemplated. For example, the emissions cleaning module 1 may be used in a variety of machines. Consequently, it may be located in a variety of orientations with respect to an engine from which the exhaust gases which flow into the emissions cleaning module derive.

One example of a variation would be the angles at which the input housing 4 and output housing 35 are with respect to the axis of the first conduit 10 and the third conduit 30, respectively.

It is further envisaged that many variations may be achieved without requiring alternative components. For example, it is not necessary to produce a different input housing or output housing in order to attach it at a different angle, dependent on the specific application.

While the illustrated embodiments show an input housing 4 having an input housing inlet 7 which is radial and an output housing 35 having an outlet 33 which is axial, for some applications it may be desirable to have an input housing with an inlet which is axial and/or an output housing with an outlet which is radial. This can be achieved by selecting the alternative input/output housing (i.e. radial and axial) since both include a baffle for diffusing the exhaust gas. Of course, other variations may be possible. It may be desirable and appropriate to have an input housing and/or an output housing with an inlet/outlet which has a radial component and an axial component. Alternatively, it may be possible to have a co-linear entry/exit or a linear offset entry/exit.

In this way, many variations on the emissions cleaning module of the specific embodiments can be realised without increasing the total part count. Furthermore, standard features can be manufactured in larger numbers and simply assembled in different manners to achieve variations in the final product.

INDUSTRIAL APPLICABILITY

In use, the emissions cleaning module 1 may be mounted to a chassis, or similar external support. A conduit originating from a source of exhaust fluid, for example a diesel combustion engine, may be connected to the input housing inlet 7 of the input housing 4. A section of external pipe work forming a portion of an exhaust arrangement may be connected to the emissions cleaning module outlet 33 of the output housing 35.

During operation exhaust fluid may be supplied to the emissions cleaning module 1 via the input housing inlet 7. The exhaust fluid may then pass into the DOC module in the first conduit 10. Prior to receipt at the inlet 7, the pressure of the exhaust fluid may be controlled by a back pressure valve.

The DOC module may function to cause oxidation of hydrocarbons ([HC]) and carbon monoxide (CO) present in the exhaust fluid to produce carbon dioxide ($CO_2$) and water ($H_2O$).

The exhaust fluid may then pass out of the first conduit 10 into the first end coupling 15 and into the second conduit 20. A reductant fluid, such as urea or ammonia, may be injected by the injector module 16 into the second end 22 of the second conduit 20 which may comprise a mixing element. Thus the reductant fluid may be mixed with the flow of exhaust fluid. Such mixing may produce a more uniform mixture of the injected fluid within the exhaust fluid.

The exhaust fluid may then pass out of the second conduit 20 into the second end coupling 25 and into the third conduit 30 and into the SCR module contained therein.

As the fluid passes over the surfaces of the catalyst within the SCR module a reaction may occur which converts the ammonia and $NO_x$ to diatomic nitrogen ($N_2$) and water ($H_2O$).

Fluid may then pass from the SCR module to the AMOX module, where present, located further downstream in the third conduit 30. The AMOX module may function to cause any residual ammonia present in the exhaust fluid to react to produce nitrogen ($N_2$) and water ($H_2O$).

From the AMOX module the fluid may pass out of the output housing 35 and into the external pipework via the outlet 33.

It should also be appreciated that use of the terms vertical and horizontal throughout this specification are in the context of the illustrated embodiments. Use of these terms should not be taken to mean that the emissions cleaning module is only useable in one (or a specific limited number) of orientations. Rather, the clean emissions module may be used in any orientation. Vertical and horizontal are thus used as relative rather than absolute terms.

The invention claimed is:

1. An emissions cleaning module comprising:
   first and second support members each having first, second and third openings;
   a first conduit extending between the first and second support members and having an inlet and an outlet, the first conduit being arranged in registration with the first openings;
   a second conduit extending between the first and second support members and having an inlet and an outlet, the second conduit being arranged in registration with the second openings;
   a third conduit extending between the first and second support members and having an inlet and an outlet, the third conduit being arranged in registration with the third openings;
   a first end coupling fluidly connecting the outlet of the first conduit to the inlet of the second conduit; and
   a second end coupling fluidly connecting the outlet of the second conduit to the inlet of the third conduit,
   a first brace and a second brace each connected at a first end to the first support member and at a second end to the second support member and extending between the first support member and the second support member in a direction parallel to an elongated axis of each of the first, second, and third conduits such that the first and second support members and the first and second braces together form a rigid rectangular mounting arrangement that holds the first, second, and third conduits relative to each other and such that a continuous fluid path is provided between the inlet of the first conduit and the outlet of the third conduit, wherein the support members, braces, conduits and couplings are arranged in a manner in which relative substantial translational movement thereof is restricted.

2. The emissions cleaning module of claim 1 wherein at least one of an oxidation catalyst, a particulate filter, a selective catalyst reduction catalyst and an ammonia oxidation catalyst is disposed in the fluid flow path.

3. The emissions cleaning module of claim 2 wherein an oxidation catalyst is disposed in the first conduit and a particulate filter is disposed within the first conduit downstream of the oxidation catalyst.

4. The emissions cleaning module of claim 2 and further comprising injection means operable to introduce a urea solution into the second conduit and a catalyst disposed in the third conduit for converting ammonia and $NO_x$ in the exhaust gas into $N_2$ and $H_2O$.

5. The emissions cleaning module of claim 4 wherein the injection means is an injector module located in the first end coupling.

6. The emissions cleaning module of claim 5 wherein the second conduit comprises a mixer module for mixing an exhaust gas from the first conduit with an emissions fluid injected by the injector module.

7. The emissions cleaning module of claim 1 wherein an oxidation catalyst is disposed in the first conduit and a particulate filter is disposed within the first conduit downstream of the oxidation catalyst.

8. The emissions cleaning module of claim 7 and further comprising injection means operable to introduce a urea solution into the second conduit and a catalyst disposed in the third conduit for converting ammonia and $NO_x$ in the exhaust gas into $N_2$ and $H_2O$.

9. The emissions cleaning module of claim 8 wherein the injection means is an injector module located in the first end coupling.

10. The emissions cleaning module of claim 1 and further comprising injection means operable to introduce a urea solution into the second conduit and a catalyst disposed in the third conduit for converting ammonia and $NO_x$ in the exhaust gas into $N_2$ and $H_2O$.

11. The emissions cleaning module of claim 10 wherein the injection means is an injector module located in the first end coupling.

12. The emissions cleaning module of claim 11 wherein the second conduit comprises a mixer module for mixing an exhaust gas from the first conduit with an emissions fluid injected by the injector module.

13. The emissions cleaning module of claim 1 wherein there is also provided an inlet module arranged in fluid communication with the inlet of the first conduit and fluidly connectable to an exhaust gas supply, the inlet module being configured to spread the exhaust gas substantially uniformly towards a first end of the first conduit.

14. The emissions cleaning module of claim 13, wherein the inlet module comprises:
   a cap mounted to the first support member and arranged to overlie the first opening;
   a generally tubular member having a perforated side wall, one closed end and one open end, the generally tubular member extending through the cap and across the first opening such that exhaust gas may be introduced through the open end and expelled through the perforated side wall before entering the first conduit.

15. The emissions cleaning module of claim 1 wherein the first and second support members are provided with first, second and third lips at least partially surrounding the first, second and third openings and to which lips the inlets and outlets of the first, second and third conduits are attached.

16. The emissions cleaning module of claim 15 wherein the second conduit includes an outer layer having inlet and outlet ends engaging an outer face of the lips surrounding the second openings and an inner layer having inlet and outlet ends engaging an inner face of the lips surrounding the second openings, the inlet and the outlet ends of the outer layer being secured to the lips and only one of the inlet and outlet ends of the inner layer being secured to the lips to allow axial expansion of the inner layer.

17. The emissions cleaning module of claim 1 wherein the first and second end couplings each comprise a cap having a hollow interior enclosed by a rim, the cap being arranged such that the rim sealingly engages the respective support member and the hollow interior, in combination with a portion of the respective support member, such as to create a passage for the exhaust gas flow between the respective inlet and outlet.

18. The emissions cleaning module of claim 17, wherein the first end coupling is provided with an access opening, a lip extending at least partway around the opening and a cover disposed in the opening and sealed to the lip.

19. The emissions cleaning module of the claim 18, wherein the lip extending partway around the opening is angled outwardly relative to the axis of the opening so as to define a surface on which the cover may rest.

20. The emissions cleaning module of claim 1, wherein the first brace and the second braces have an L-shaped cross-section including a vertical portion and a horizontal portion at each longitudinal end and an aperture disposed at a central region between the longitudinal ends.

\* \* \* \* \*